United States Patent
Paik et al.

(10) Patent No.: US 12,401,877 B2
(45) Date of Patent: *Aug. 26, 2025

(54) CAMERA MODULE WITH IMPROVED MOBILITY AND CAMERA APPARATUS COMPRISING SAME

(71) Applicant: LG INNOTEK CO., LTD., Seoul (KR)

(72) Inventors: Jee Heum Paik, Seoul (KR); Duck Hoon Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/627,126

(22) Filed: Apr. 4, 2024

(65) Prior Publication Data

US 2024/0251149 A1     Jul. 25, 2024

Related U.S. Application Data

(63) Continuation of application No. 17/420,433, filed as application No. PCT/KR2020/000316 on Jan. 8, 2020, now Pat. No. 11,979,652.

(30) Foreign Application Priority Data

Jan. 8, 2019    (KR) .......................... 10-2019-0002244

(51) Int. Cl.
*H04N 23/55*      (2023.01)
*H04N 23/51*      (2023.01)
(Continued)

(52) U.S. Cl.
CPC ............. *H04N 23/55* (2023.01); *H04N 23/51* (2023.01); *H04N 23/54* (2023.01); *H04N 23/57* (2023.01)

(58) Field of Classification Search
CPC ........ H04N 23/55; H04N 23/51; H04N 23/54; H04N 23/57; H04N 23/687; H05K 1/147;
(Continued)

(56) References Cited

U.S. PATENT DOCUMENTS 7,639,933 B2    12/2009   Seo et al.
7,952,613 B2 *   5/2011   Sekino ................... H04N 23/68
                                          348/208.7
(Continued)

FOREIGN PATENT DOCUMENTS

CN       105022204 A     11/2015
JP       2015-18268 A     1/2015
(Continued)

OTHER PUBLICATIONS

International Search Report, issued in PCT/KR2020/000316, dated Apr. 23, 2020.

*Primary Examiner* — Gevell V Selby
(74) *Attorney, Agent, or Firm* — Birch, Stewart, Kolasch & Birch, LLP

(57) ABSTRACT

A camera module includes a first driving part on a lower surface of an image sensor substrate, and a second driving part on a lower surface of the housing to face a lower surface of the first driving part. The first driving part includes a first driving part of a first group configured to move the image sensor substrate in a first direction with respect to the lens barrel, and a second driving part of a second group configured to move the image sensor substrate in a second direction intersecting the first direction with respect to the lens barrel. The second driving part includes a second driving part of a first group disposed overlapping the first driving part of the first group in a vertical direction, and a second driving part of a second group disposed overlapping the first driving part of the second group in the vertical direction.

19 Claims, 19 Drawing Sheets

(51) Int. Cl.
*H04N 23/54* (2023.01)
*H04N 23/57* (2023.01)

(58) Field of Classification Search
CPC ......... H05K 1/189; H05K 2201/10121; H05K 2201/10151; H05K 1/111; H05K 1/181
See application file for complete search history.

(56) References Cited

U.S. PATENT DOCUMENTS

| | | | |
|---|---|---|---|
| 8,279,293 B2* | 10/2012 | Noto | H04N 23/68 |
| | | | 348/208.7 |
| 9,936,134 B2 | 4/2018 | Enta | |
| 11,979,652 B2* | 5/2024 | Paik | H04N 23/54 |
| 2006/0017815 A1 | 1/2006 | Stavely et al. | |
| 2006/0133786 A1 | 6/2006 | Teramoto | |
| 2009/0128673 A1* | 5/2009 | Okamoto | H04N 23/54 |
| | | | 348/294 |
| 2009/0252489 A1 | 10/2009 | Huang et al. | |
| 2017/0353662 A1 | 12/2017 | Enta | |
| 2019/0141248 A1 | 5/2019 | Hubert et al. | |
| 2019/0191089 A1 | 6/2019 | Kimura | |
| 2019/0391410 A1 | 12/2019 | Park et al. | |
| 2020/0192187 A1 | 6/2020 | Lee | |
| 2020/0192191 A1 | 6/2020 | Wade et al. | |

FOREIGN PATENT DOCUMENTS

| | | |
|---|---|---|
| JP | 2016-122055 A | 7/2016 |
| JP | 6252640 B2 | 12/2017 |
| JP | 2018-180506 A | 11/2018 |
| JP | 2020-95136 A | 6/2020 |
| KR | 10-0646560 B1 | 11/2006 |
| KR | 10-1762093 B1 | 7/2017 |
| KR | 10-1872579 B1 | 6/2018 |
| KR | 10-2018-0101705 A | 9/2018 |
| KR | 10-2019-0001299 A | 1/2019 |
| WO | WO 2017/156462 A1 | 9/2017 |

* cited by examiner

[FIG. 1]
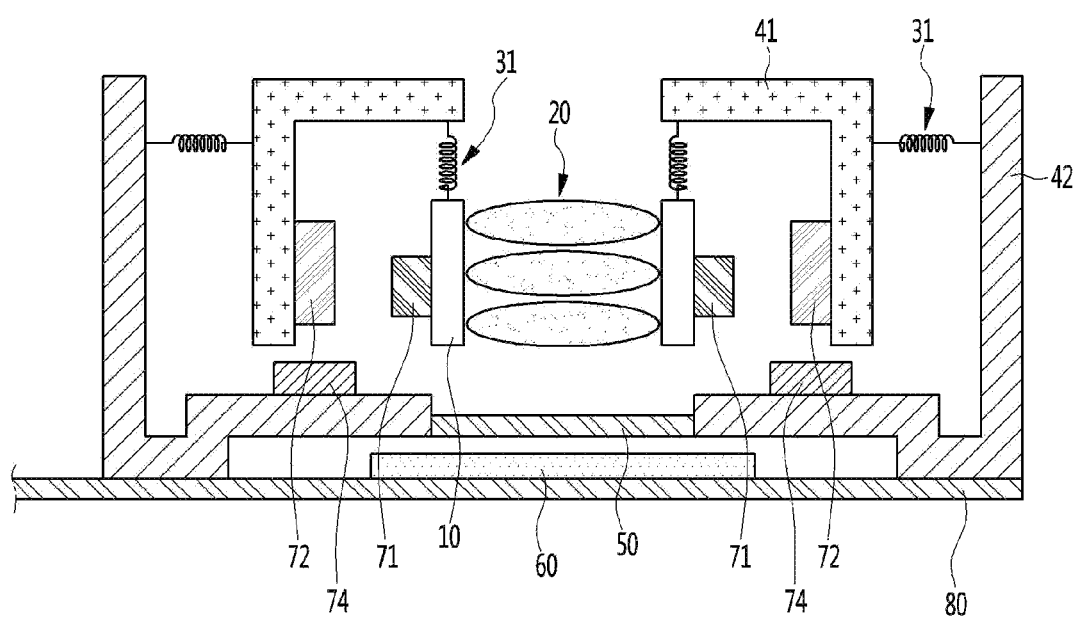

[FIG. 2]
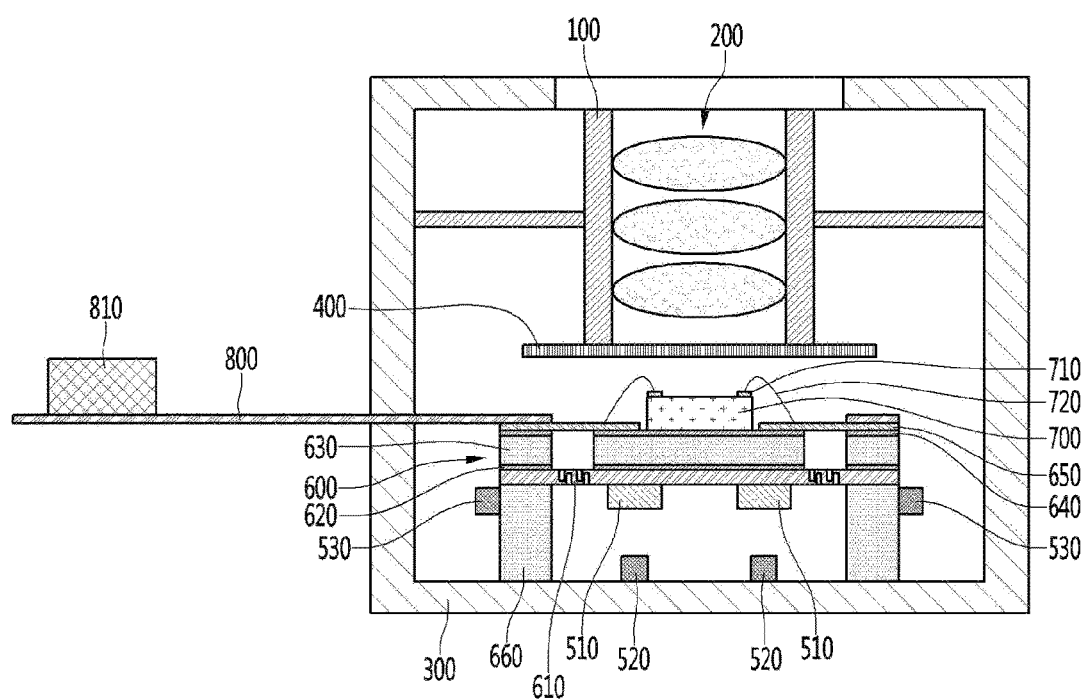

[FIG. 3]
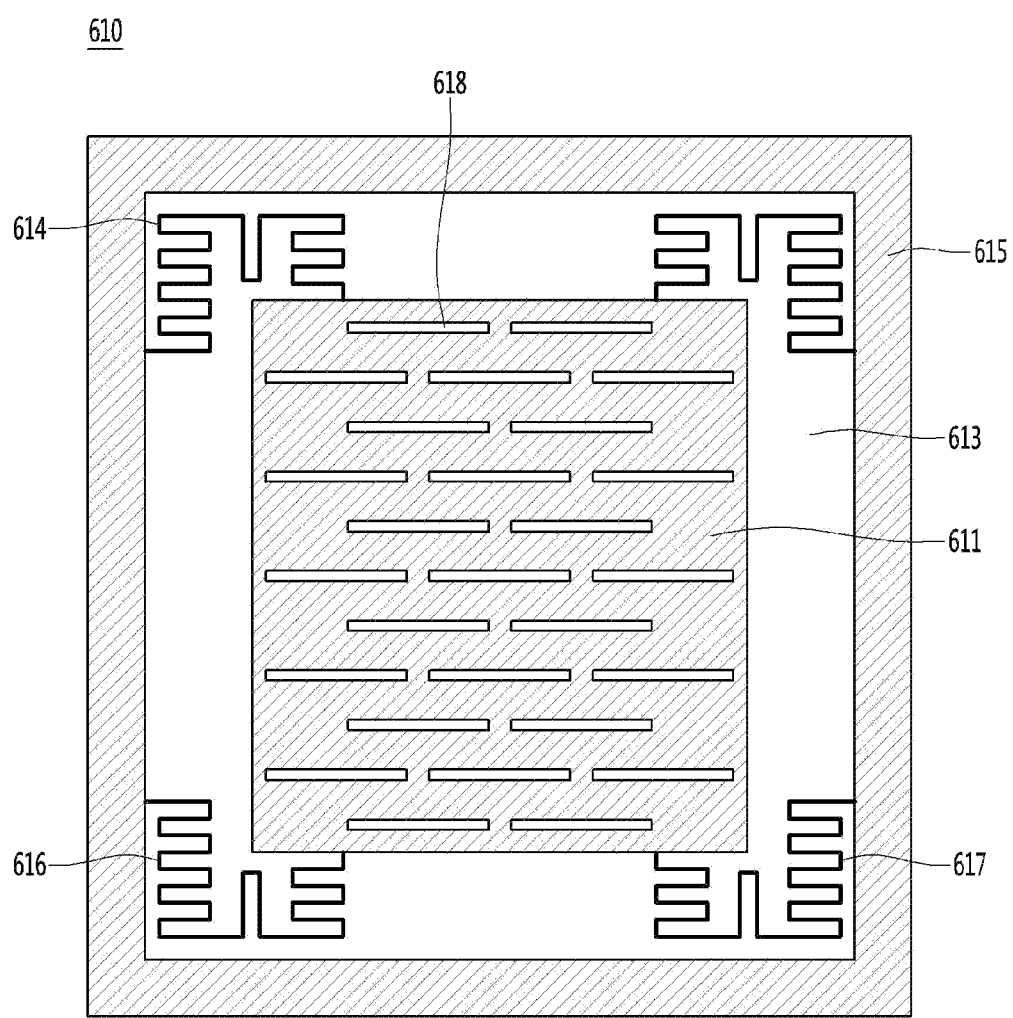

【FIG. 4】
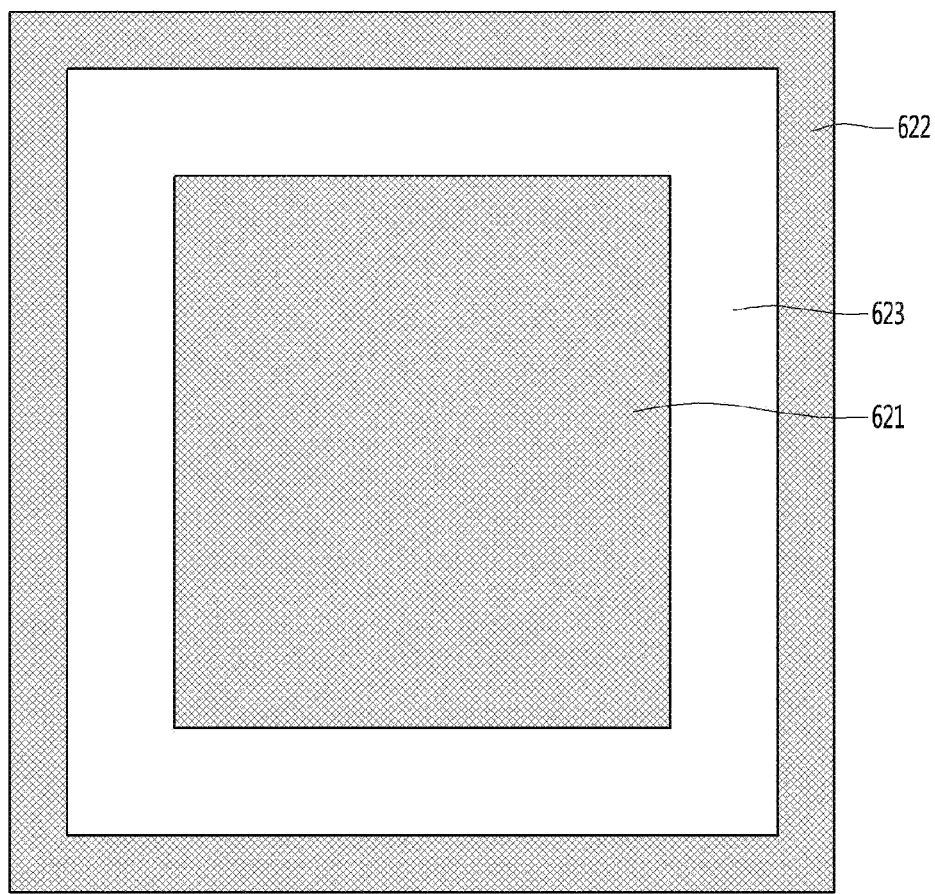

【FIG. 5】
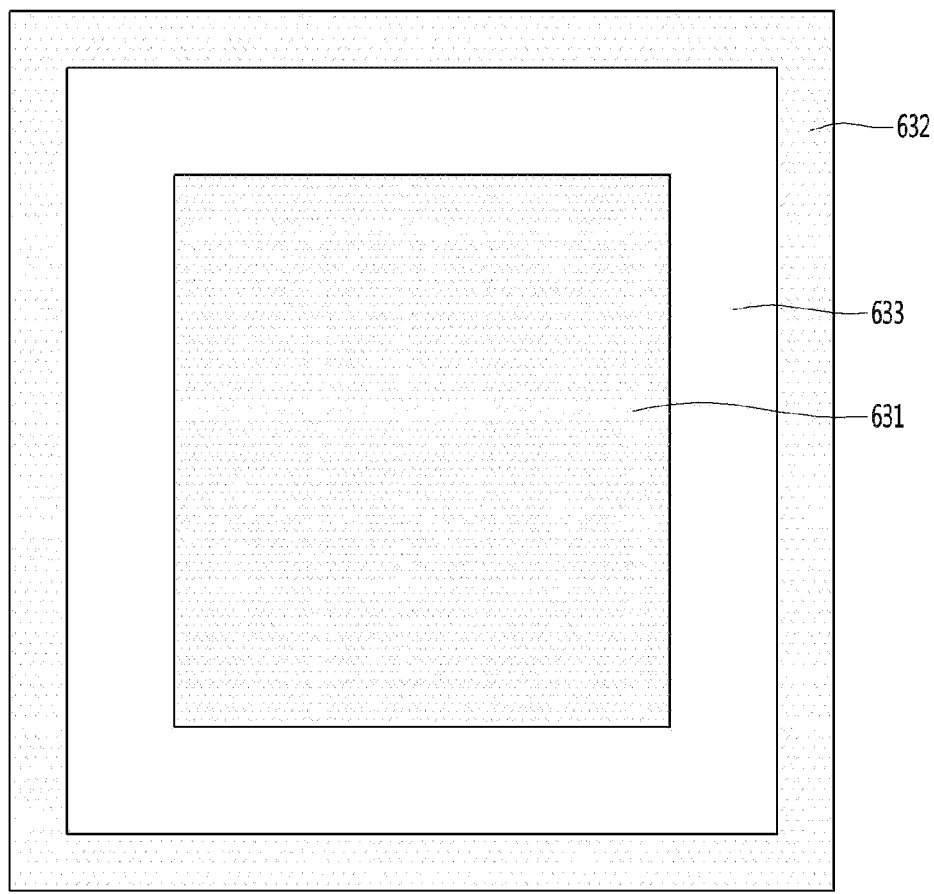

[FIG. 6]
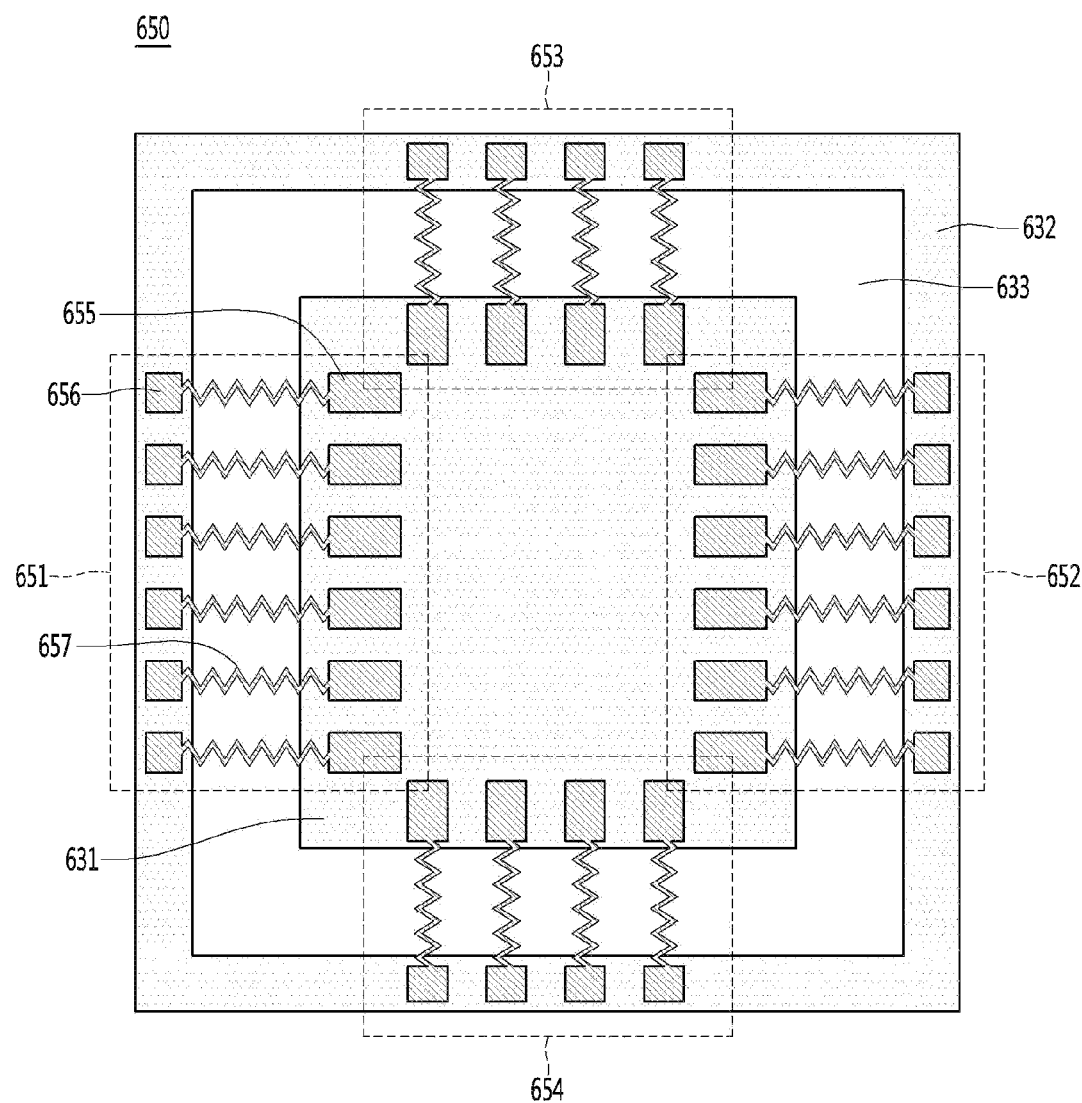

【FIG. 7】
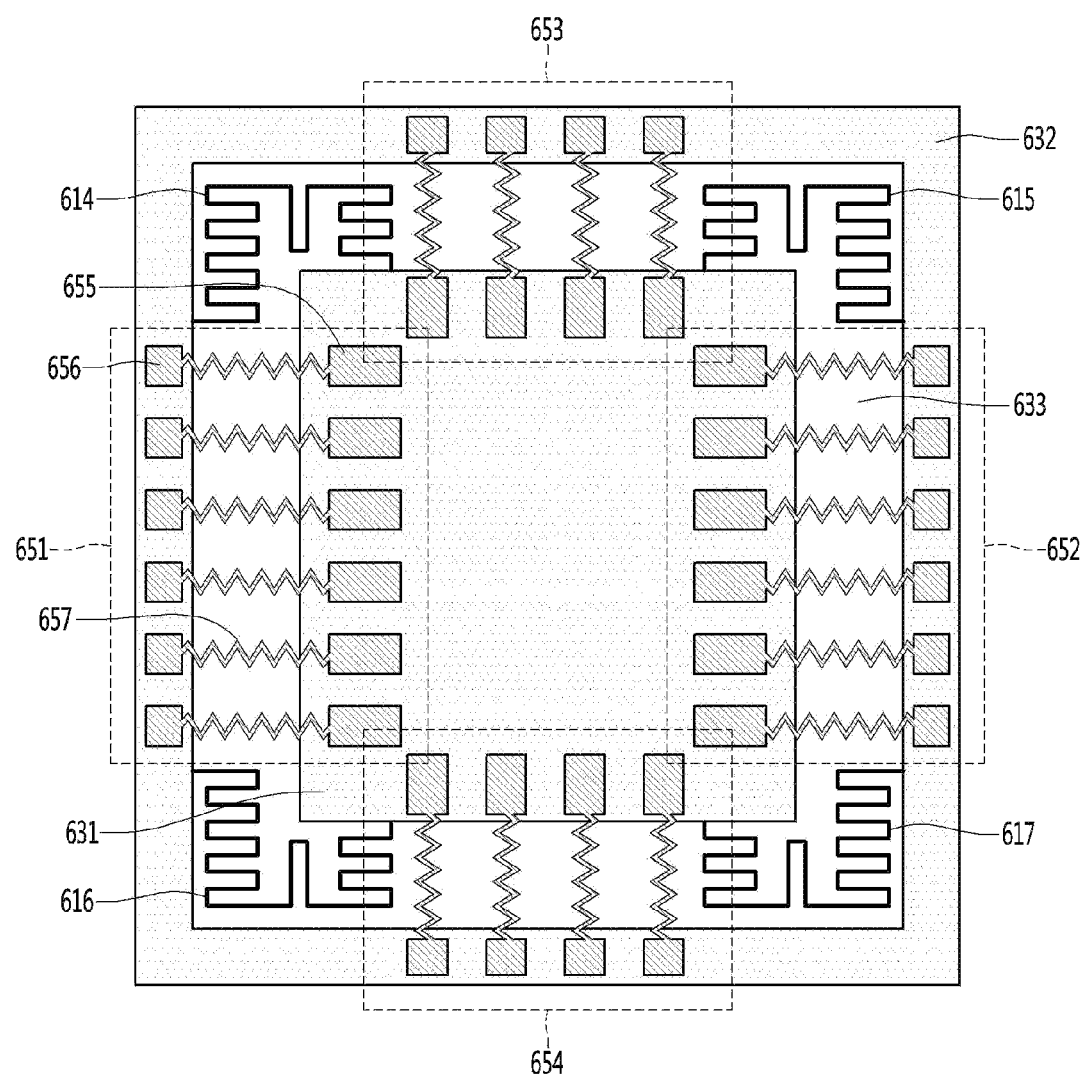

[FIG. 8]
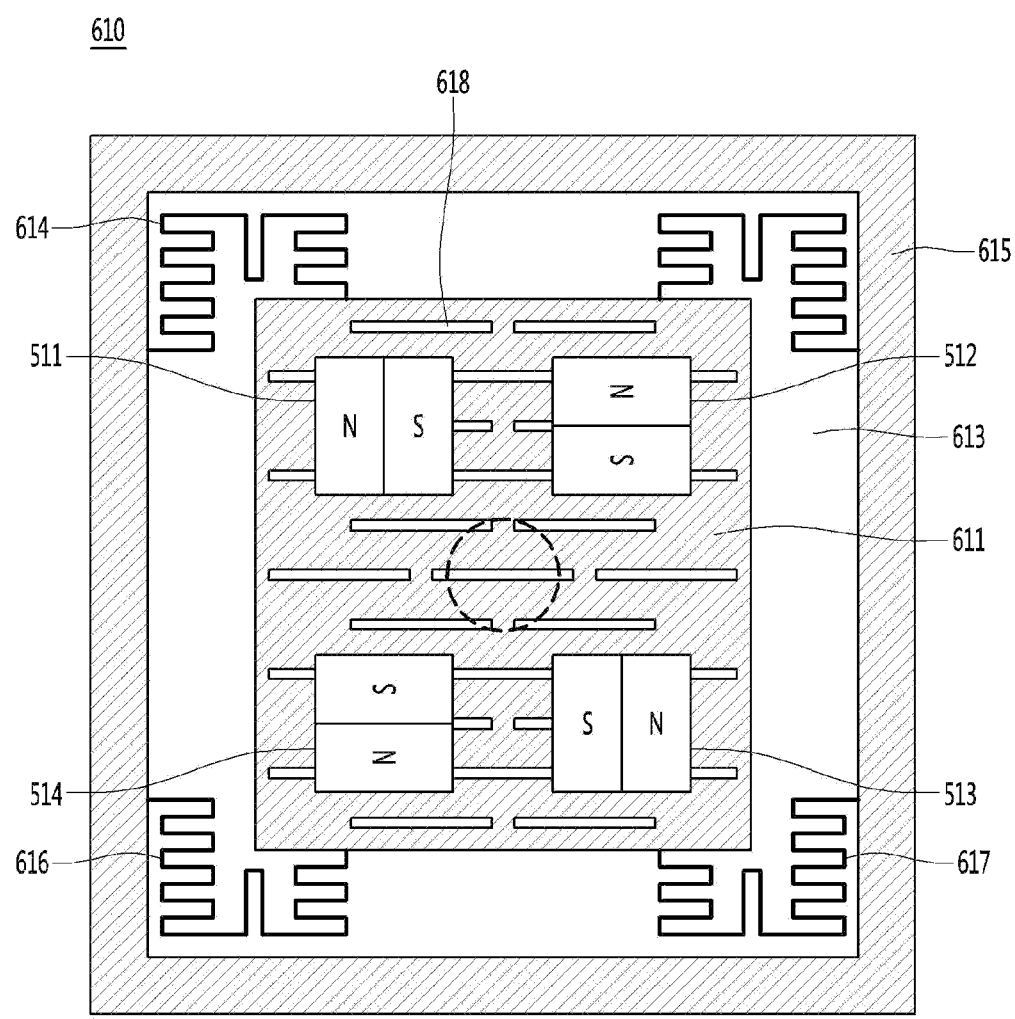

[FIG. 9]
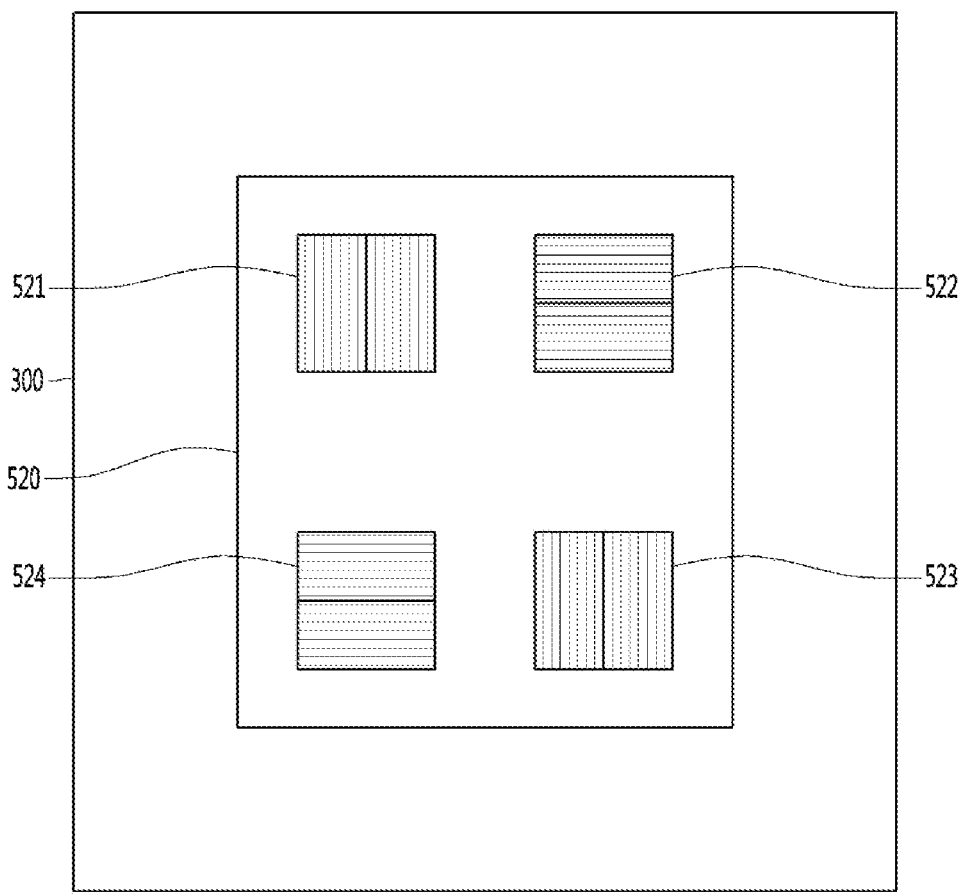

[FIG. 10]
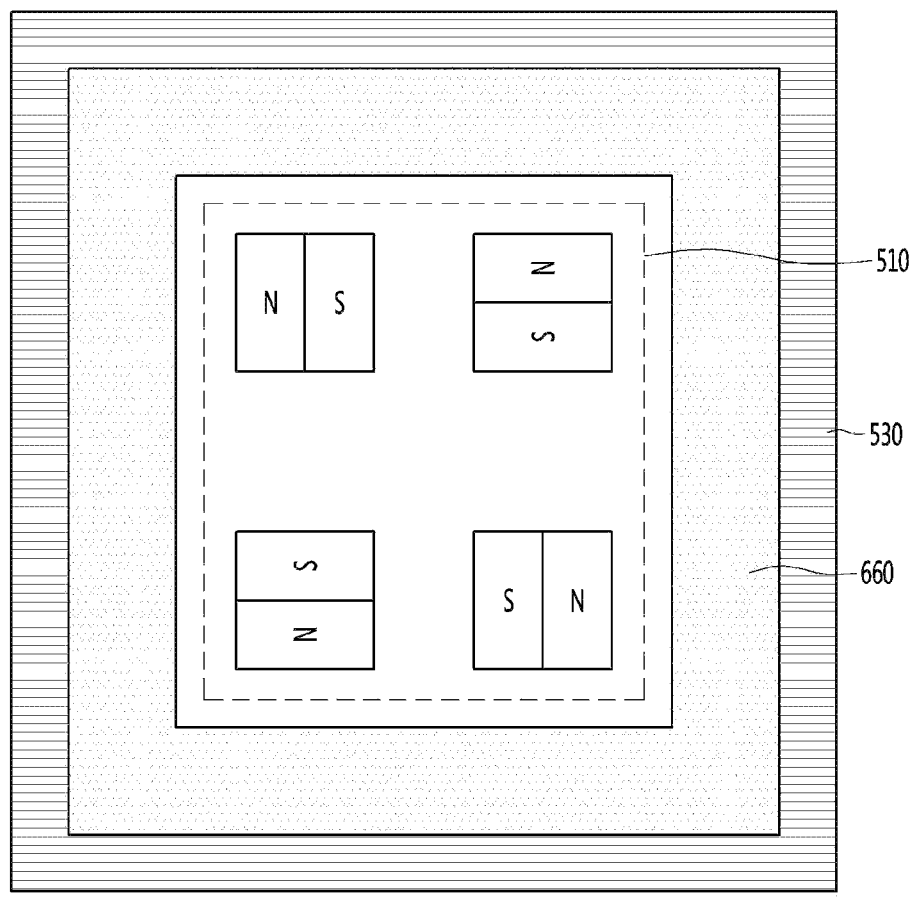

[FIG. 11]
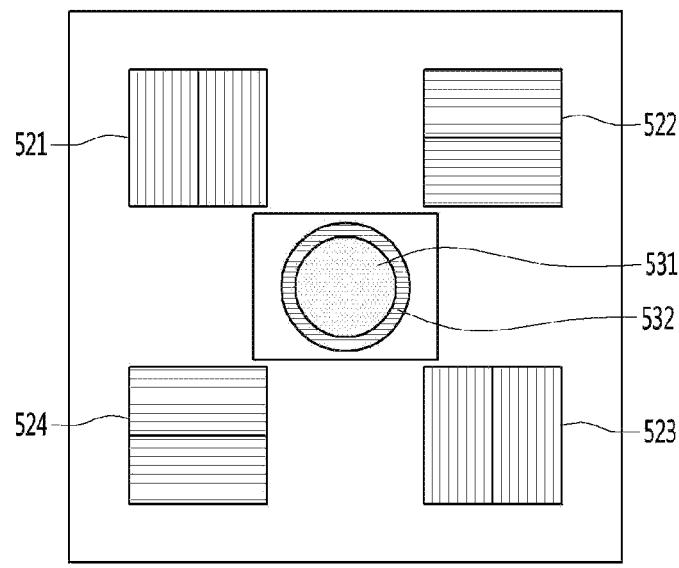
[FIG. 12]
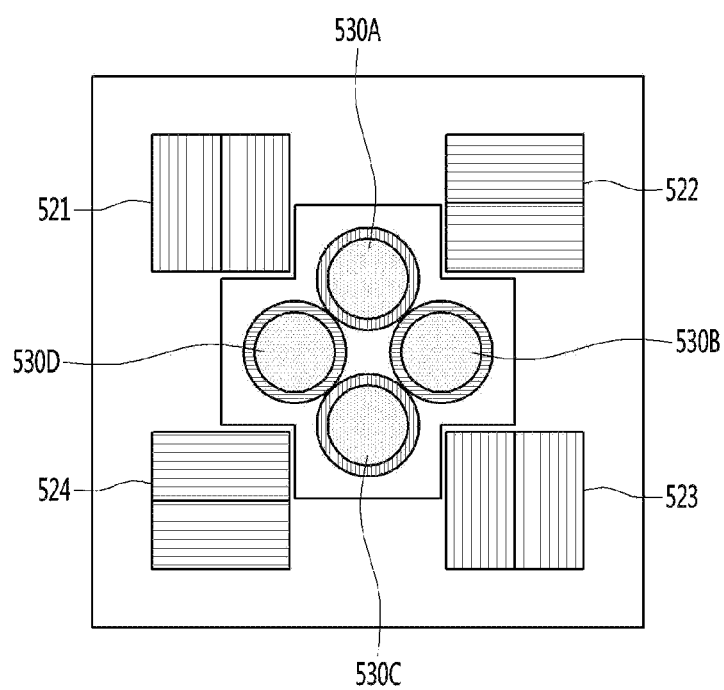

[FIG. 13]
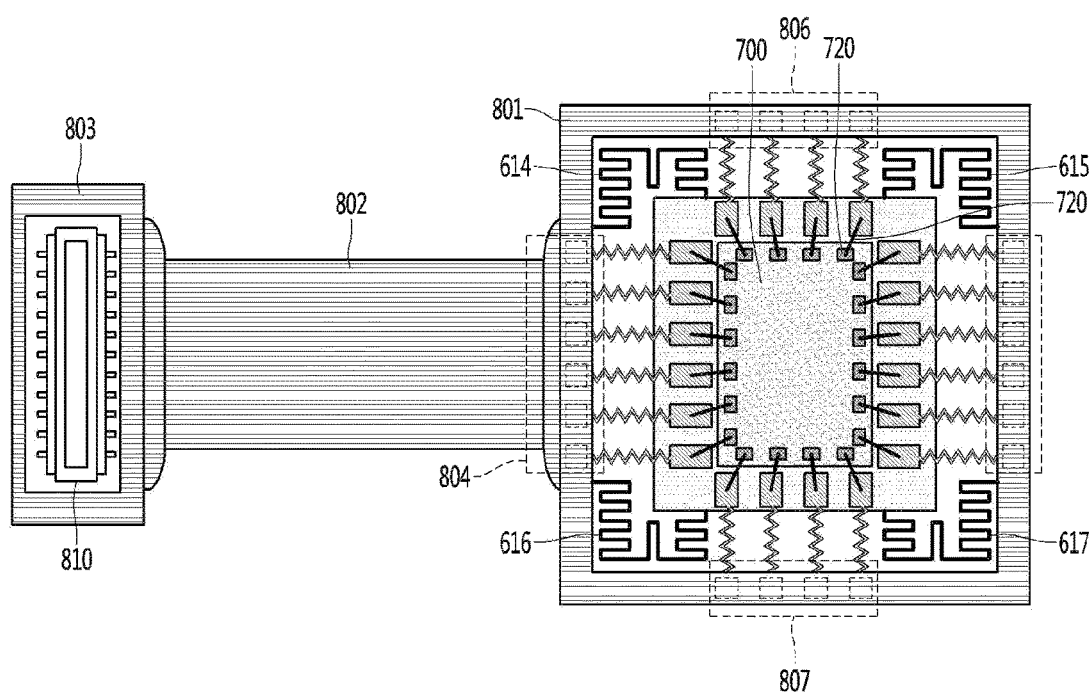
[FIG. 14]
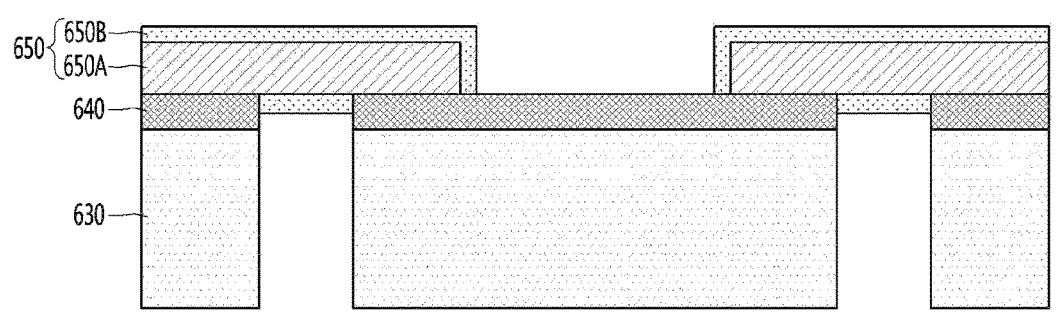

【FIG. 15】
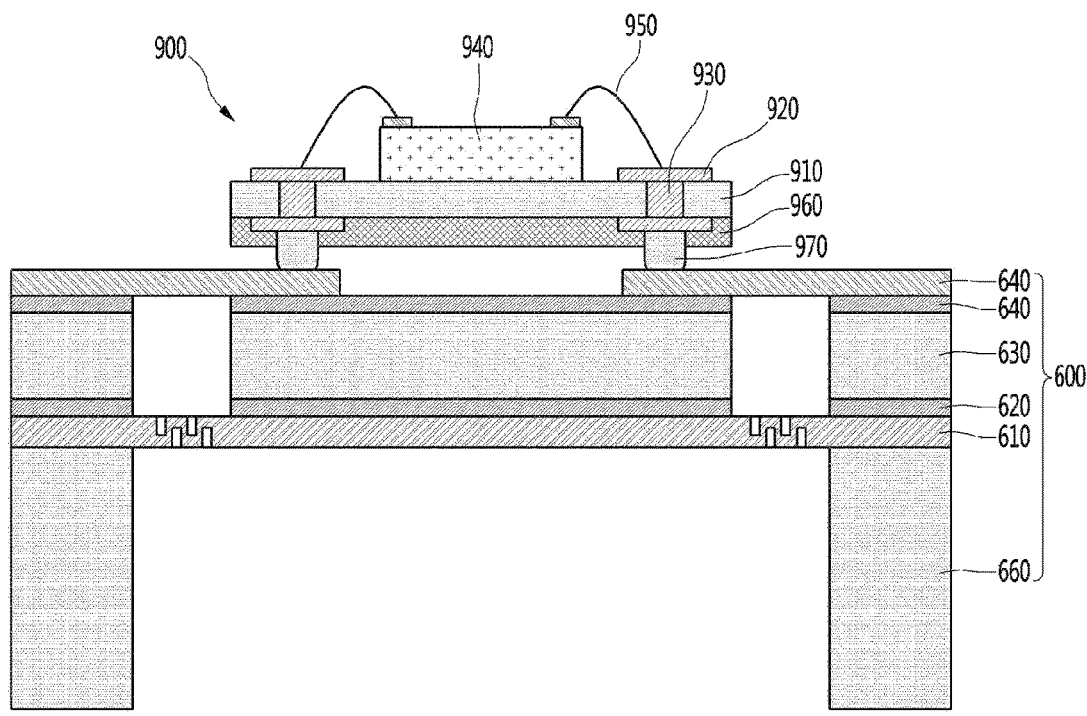

[FIG. 16]
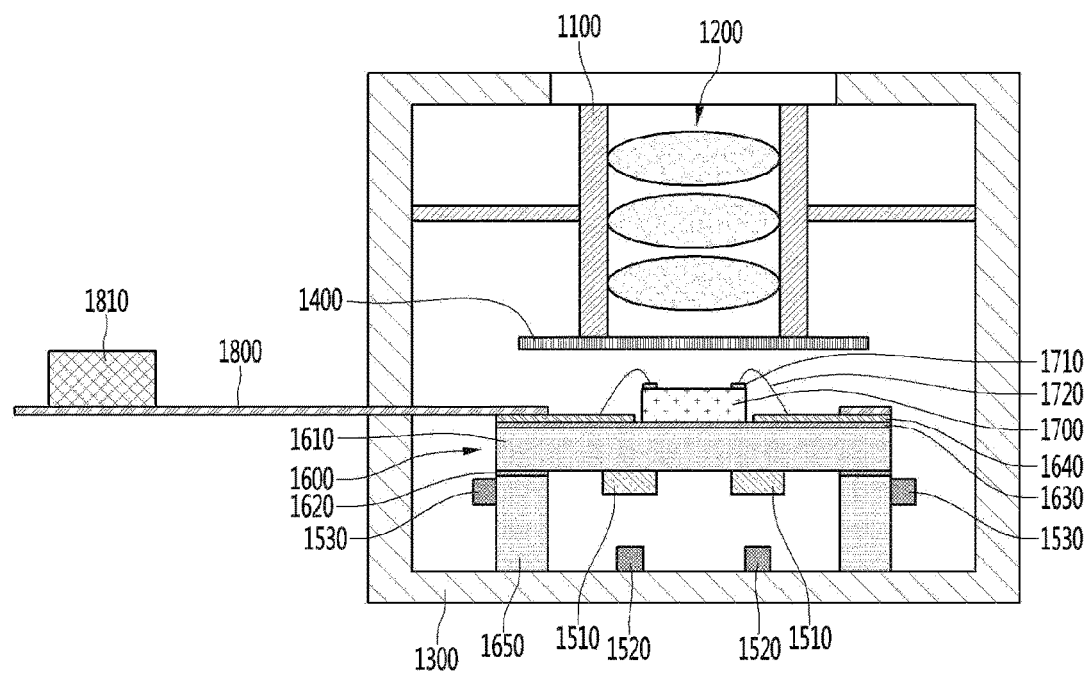

【FIG. 17】
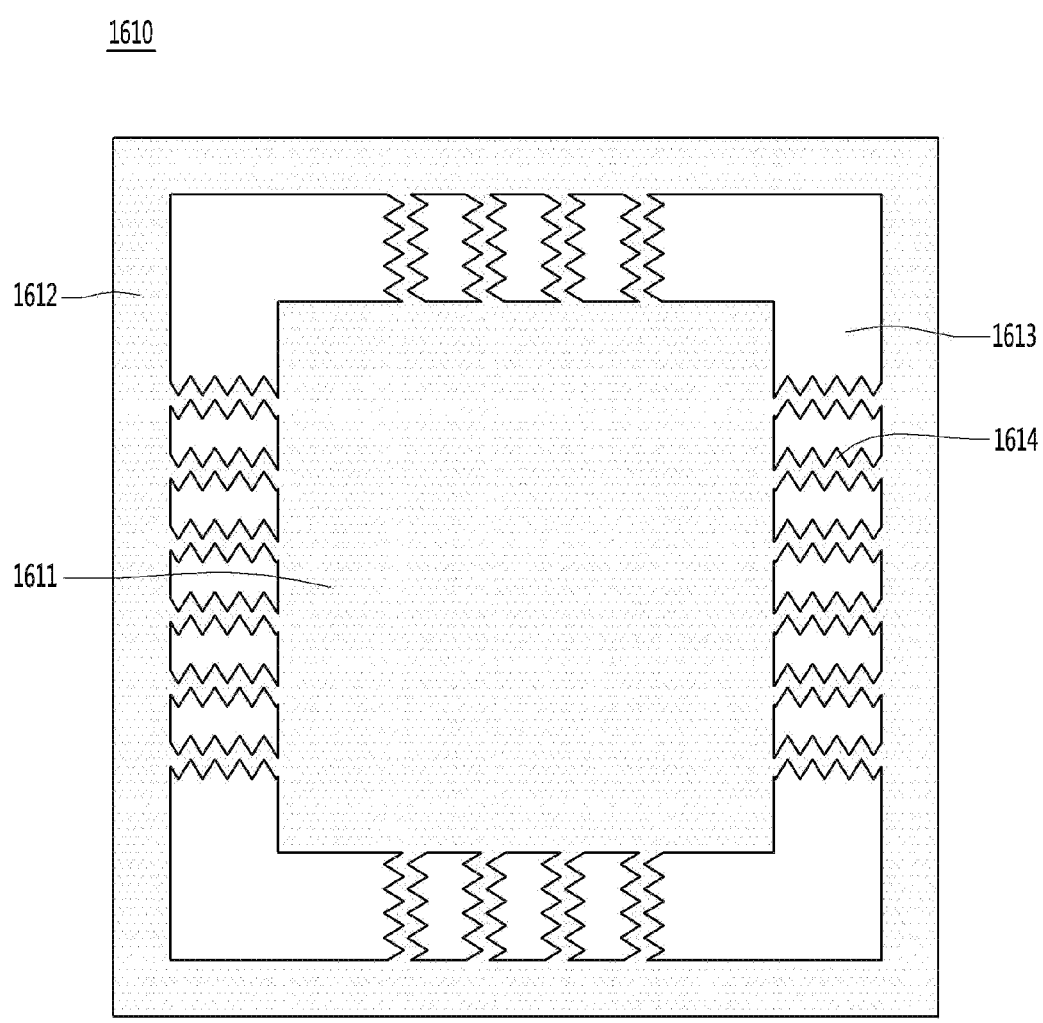

[FIG. 18]
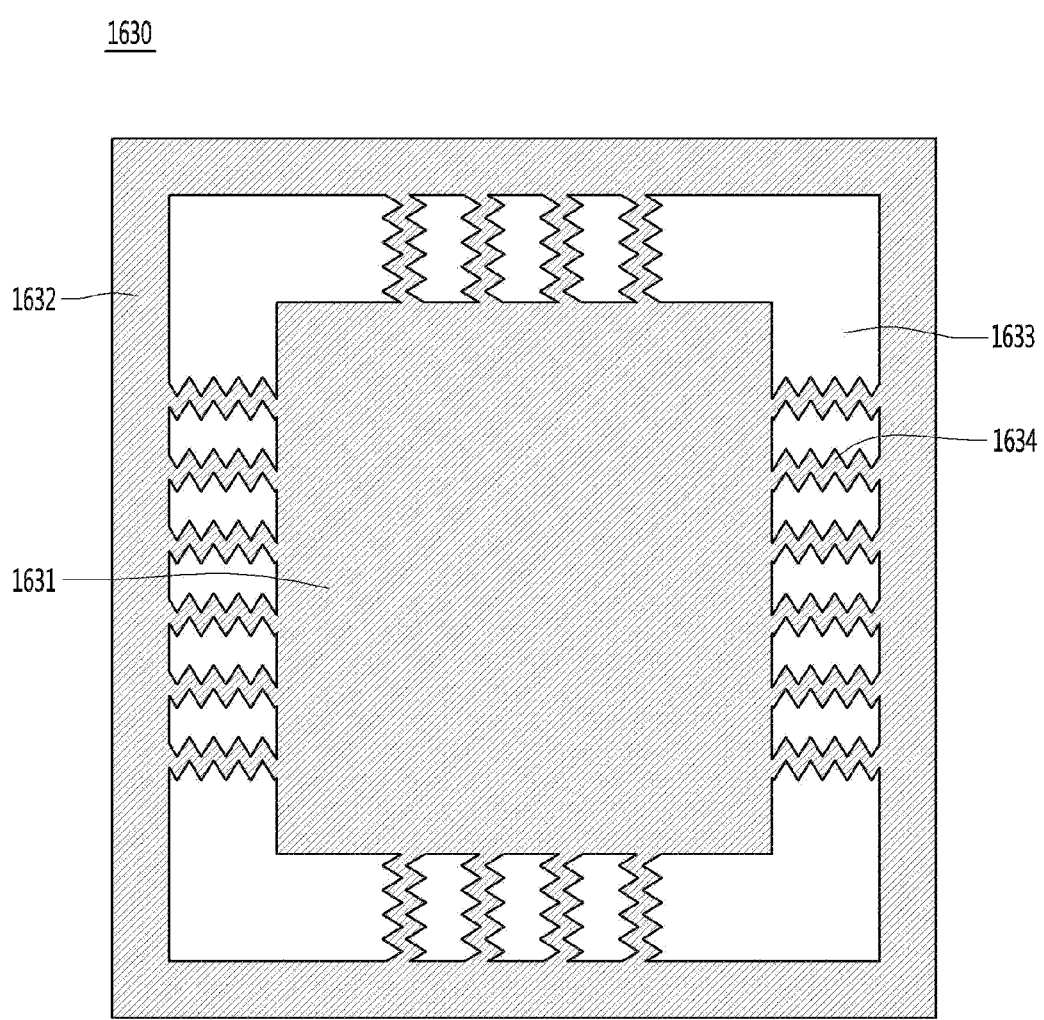

[FIG. 19]
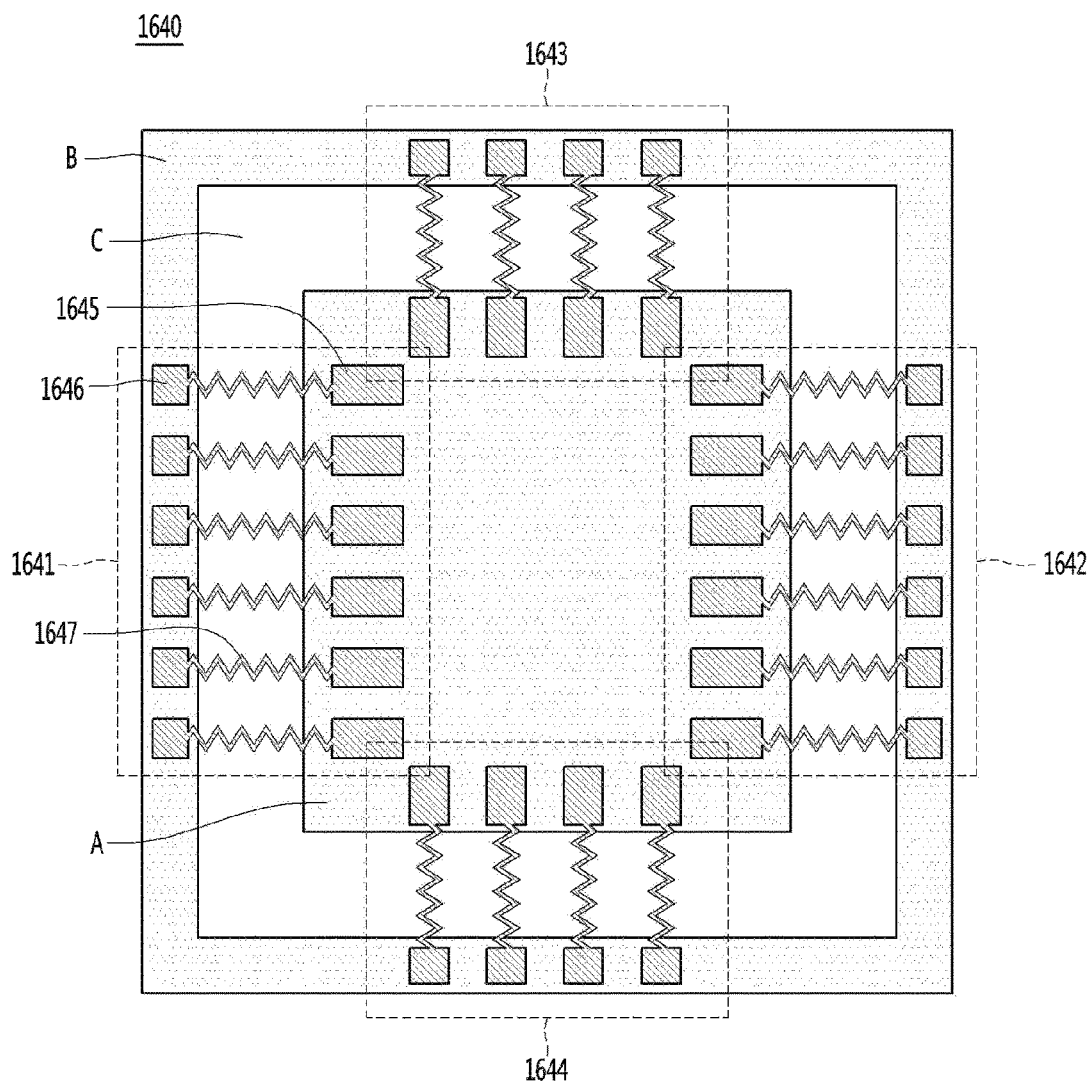

[FIG. 20]
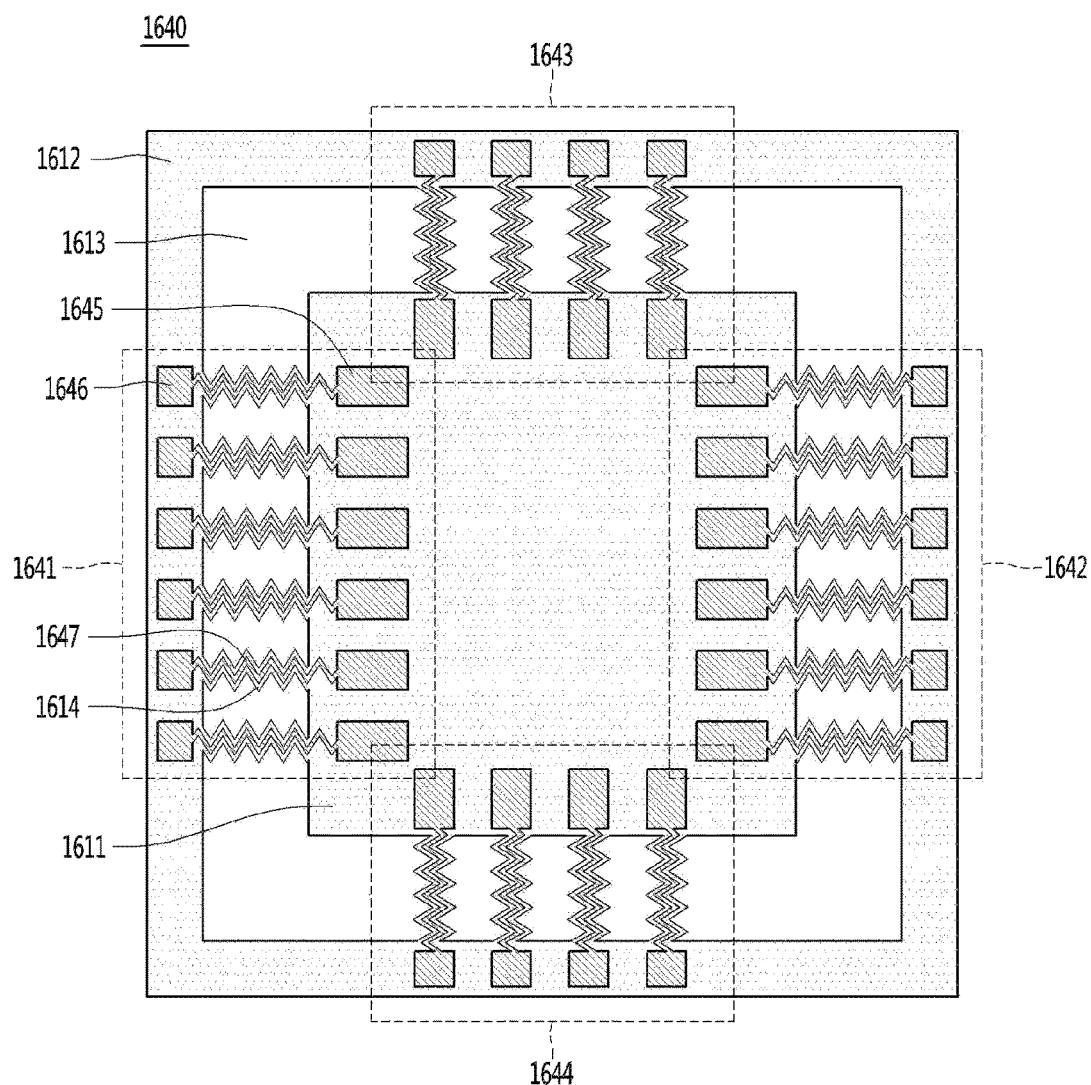

[FIG. 21]
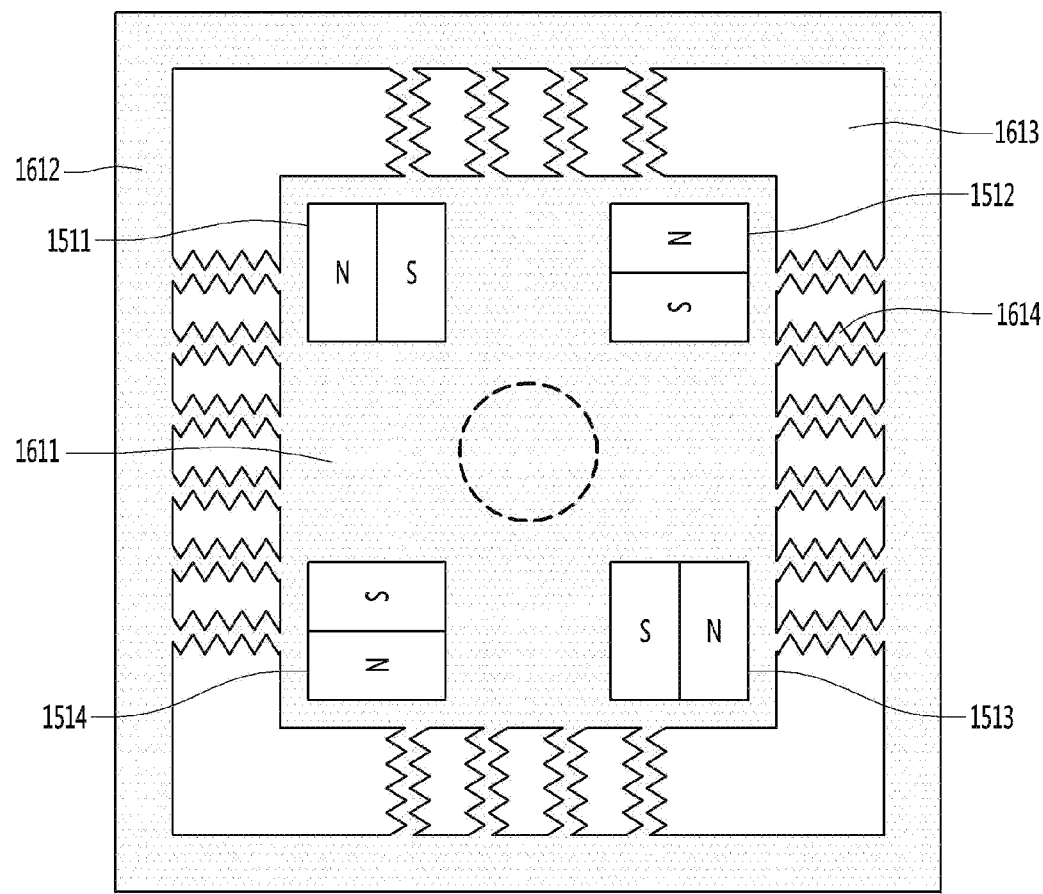

CAMERA MODULE WITH IMPROVED MOBILITY AND CAMERA APPARATUS COMPRISING SAME

CROSS REFERENCE TO RELATED APPLICATIONS

This application is a Continuation of U.S. application Ser. No. 17/420,433, filed on Jul. 2, 2021, which is the National Phase of PCT International Application No. PCT/KR2020/000316, filed on Jan. 8, 2020, which claims priority under 35 U.S.C. 119(a) to Patent Application No. 10-2019-0002244, filed in the Republic of Korea on Jan. 8, 2019, all of which are hereby expressly incorporated by reference into the present application.

TECHNICAL FIELD

The embodiment relates to a camera module, and more particularly, to a camera module for relatively moving an image sensor with respect to a lens barrel, and a camera device including the same.

BACKGROUND ART

In general, camera devices are mounted in mobile communication terminals and portable devices such as MP3 players, as well as electronic devices such as automobiles, endoscopes, and CCTVs. Such camera devices are gradually being developed centering on high pixels, and miniaturization and thinning are in progress. In addition, current camera devices are being changed so that various additional functions can be implemented at low manufacturing cost.

The camera device as described above includes a lens barrel accommodating a lens, a lens holder coupled to the lens barrel, an image sensor disposed in the lens holder, and a driving substrate on which the image sensor is mounted. At this time, the lens prod provides an image signal of a subject to the image sensor. And the image sensor converts the image signal into an electrical signal.

Here, the accuracy of the image signal in the camera device is determined according to a focal length defined as the distance between the lens and the image sensor.

Accordingly, the camera device provides focus compensation or shake compensation by moving the lens barrel relative to the image sensor. That is, the camera device moved the lens barrel accommodating the lens relative to the image sensor in the X-axis, Y-axis, and Z-axis. At this time, the camera device required an elastic member such as at least six springs to move the lens barrel. In addition, the elastic member was bonded to the lens barrel by bonding.

However, the camera device according to the prior art as described above, by moving the lens barrel, the upper spring plate disposed on the lens barrel, the lower spring plate under the lens barrel, and an elastic wire for fixing the Z-axis (elastic wire) Includes structures such as Accordingly, the module structure of the camera device according to the prior art has a complicated problem.

In addition, the camera device according to the prior art requires a plurality of elastic members for moving the lens barrel, and there is a problem in that the number of assembling steps of the plurality of elastic members increases.

DISCLOSURE

Technical Problem

In the embodiment, it is possible to provide a substrate for an image sensor having a new structure and a camera module including the same.

In addition, in the embodiment, it is possible to provide an image sensor substrate for an image sensor moving relative to a lens barrel, and a camera module including the same.

In addition, in the embodiment, a substrate for an image sensor capable of not only movement of the X-axis, Y-axis, and Z-axis, but also tilt correction, and a camera module including the same are provided.

In addition, in the embodiment, a substrate for an image sensor capable of simplifying a spring structure for providing an auto focus function or a camera shake compensation function, and a camera module including the same can be provided.

The technical problems to be achieved in the proposed embodiment are not limited to the technical problems mentioned above, and other technical problems not mentioned may be clearly understood by those of ordinary skill in the art to which the proposed embodiment belongs from the following description.

Technical Solution

A camera module according to an embodiment includes a housing; a lens barrel disposed in the housing; a lens assembly disposed in the lens barrel; an image sensor substrate disposed in the housing; an image sensor disposed on the image sensor substrate; a first driving part disposed under a lower surface of the image sensor substrate; and a second driving part disposed under a lower surface of the housing and having an upper surface facing a lower surface of the first driving part, wherein the image sensor substrate includes: a substrate portion; a conductive pattern portion disposed on the substrate portion; and a support layer disposed under the substrate portion, wherein the first driving part includes: a first driving part of a first group configured to move the image sensor substrate in a first direction with respect to the lens barrel; and a second driving part of a second group configured to move the image sensor substrate in a second direction intersecting the first direction with respect to the lens barrel, wherein the second driving part includes: a second driving part of a first group disposed overlapping the first driving part of the first group in a vertical direction; and a second driving part of a second group disposed overlapping the first driving part of the second group in the vertical direction.

In addition, the first driving part includes a permanent magnet, and the second driving part includes a coil.

In addition, the first driving part of the first group includes a first-first driving part and a first-third driving part respectively disposed under a lower surface of the spring plate and having a N pole and a S pole arranged in the first direction, and the first driving part of the second group includes a first-second driving part and first-fourth driving part respectively disposed on the lower surface of the spring plate and having a N pole and a S pole arranged in the second direction.

In addition, arrangement directions of the N poles and S poles of the first-first to first-fourth driving parts are different from each other.

In addition, the first direction is an X-axis direction, the second direction is a Y-axis direction, wherein the N poles and the S poles of the first-first driving part and the first-third driving part are arranged in a +X-axis direction and a −X-axis direction opposite to each other, and wherein the N poles and S poles of the first-second driving part and the first-fourth driving part are arranged in a +Y axis direction and a −Y axis direction opposite to each other.

In addition, the arrangement direction of the N pole and S pole of each of the first-first to first-fourth driving parts is perpendicular to the arrangement direction of an adjacent driving part.

In addition, the first-first driving part and the first-third driving part are respectively disposed in corner regions in a diagonal direction to each other under the lower surface of the substrate portion, and the first-second driving part and the first-fourth driving part are respectively disposed in corner regions in a diagonal direction to each other.

In addition, the first driving part of the first group is configured to move the image sensor substrate in the +X-axis direction or the −X-axis direction when currents in different directions are applied to the first-first driving part and the first-third driving part, and the first driving part of the first group is configured to tilt the image sensor substrate when currents in the same direction are applied to the first-first driving part and the first-third driving part.

In addition, the first driving part of the second group is configured to move the image sensor substrate in the +Y-axis direction or the −Y-axis direction when currents in different directions are applied to the first-second driving part and the first-fourth driving part, and the first driving part of the second group is configured to tilt the image sensor substrate when currents in the same direction are applied to the first-second driving part and the first-fourth driving part.

In addition, the camera module includes a third driving part disposed on the support layer so that a side surface overlaps the first driving part of the first group and the first driving part of the second group in a horizontal direction, and configured to move the image sensor substrate in a third direction corresponding to a Z-axis.

In addition, the camera module includes a third driving part disposed under on the bottom surface of the housing and overlapping the first driving part in a vertical direction, wherein an upper surface of the third driving part includes a first region overlapping the S pole of the first-first driving part in a vertical direction; a second region overlapping the S pole of the first-second driving part in a vertical direction; a third region overlapping the S pole of the first-third driving part in a vertical direction; and a fourth region overlapping the S pole of the first-fourth driving part in a vertical direction, and wherein the second driving part overlaps with a remaining region of lower surfaces of the first-first driving part to the first-fourth driving part except for the region overlapping the third driving part.

In addition, the substrate portion may include a spring plate having an elastic member disposed in a first open region; and an insulating layer disposed on the spring plate and having a second open region exposing the first open region, wherein the spring plate includes a first plate part; and a second plate part disposed around the first plate part with the first open region interposed therebetween, and connected to the first plate part by the elastic member, wherein the insulating layer includes a first insulating part disposed on the first plate part; a second insulating part disposed on the second plate part; wherein the conductive pattern portion includes a first lead pattern part disposed on the first insulating part, a second lead pattern part disposed on the second insulating part; and an extension pattern part disposed between the first and second lead pattern parts and floating on the second open region; and wherein the first driving part is disposed under a lower surface of the first plate part.

In addition, the substrate portion includes an insulating layer; and a bonding sheet disposed on the insulating layer, wherein the insulating layer includes a first insulating part; a second insulating part disposed around the first insulating part and spaced apart from the first insulating part with a first open region therebetween; and an extension insulating part disposed in the first open region and connecting the first insulating part and the second insulating part; wherein the conductive pattern portion includes a first lead pattern part disposed on the first insulating part; a second lead pattern part disposed on the second insulating part; and an extension pattern part disposed on the extension insulating part and connecting between the first lead pattern part and the second lead pattern part, wherein the extension insulating part and the extension pattern part have a spring shape, and wherein the first driving part is disposed under a lower surface of the first insulating part.

On the other hand, a camera device according to an embodiment includes a housing; a lens barrel disposed in the housing; a lens assembly disposed in the lens barrel; an image sensor substrate disposed in the housing; a first driving part disposed under a lower surface of the image sensor substrate; a second driving part disposed under a lower surface of the housing and having an upper surface facing a lower surface of the first driving part; a third driving part disposed on a side surface of the image sensor substrate and having a side surface facing a side surface of the first driving part; an image sensor disposed on the image sensor substrate; and a flexible circuit board including a first connector part disposed in the housing and electrically connected to the image sensor substrate, a second connector part disposed outside the housing and electrically connected to an external device, and a connection part connecting the first and second connector parts, wherein the image sensor substrate includes: a substrate portion; a conductive pattern portion disposed on the substrate portion; and a support layer disposed under the substrate portion, wherein the first driving part includes: a first driving part of a first group configured to move the image sensor substrate in a first direction with respect to the lens barrel; and a second driving part of a second group configured to move the image sensor substrate in a second direction intersecting the first direction with respect to the lens barrel, wherein the second driving part includes: a second driving part of a first group disposed overlapping the first driving part of the first group in a vertical direction; and a second driving part of a second group disposed overlapping the first driving part of the second group in the vertical direction, wherein the first driving part of the first group includes a first-first driving part and a first-third driving part respectively disposed under a lower surface of the spring plate and having a N pole and a S pole arranged in the first direction, and the first driving part of the second group includes a first-second driving part and first-fourth driving part respectively disposed on the lower surface of the spring plate and having a N pole and a S pole arranged in the second direction, and wherein arrangement directions of the N poles and S poles of the first-first to first-fourth driving parts are different from each other.

In addition, the first-first driving part and the first-third driving part are respectively disposed in corner regions in a diagonal direction to each other under the lower surface of the substrate portion, and the first-second driving part and the first-fourth driving part are respectively disposed in corner regions in a diagonal direction to each other, wherein the first driving part of the first group is configured to move the image sensor substrate in the +X-axis direction or the −X-axis direction when currents in different directions are applied to the first-first driving part and the first-third driving part, and the first driving part of the first group is configured to tilt the image sensor substrate when currents in the same direction are applied to the first-first driving part and the first-third driving part, wherein the first driving part of the second group is configured to move the image sensor substrate in the +Y-axis direction or the −Y-axis direction when currents in different directions are applied to the first-second driving part and the first-fourth driving part, and the first driving part of the second group is configured to tilt the image sensor substrate when currents in the same direction are applied to the first-second driving part and the first-fourth driving part.

Effects of the Invention

According to an embodiment, in order to implement the OIS and AF functions of the camera module, instead of moving the conventional lens barrel, the image sensor is moved with respect to the lens barrel in the X-axis, Y-axis and Z-axis directions. Accordingly, the camera module according to the embodiment may remove a complex spring structure for implementing the OIS and AF functions, and thus the structure may be simplified. In addition, by moving the image sensor according to the embodiment with respect to the lens barrel, it is possible to provide a stable structure compared to the conventional structure.

In addition, according to an embodiment, the extension pattern part electrically connected to the image sensor has a spring structure and is disposed to float on a spring plate. Accordingly, the camera module may move the image sensor while elastically supporting the image sensor more stably. In addition, the length of the extension pattern part is at least 1.5 to 4 times the linear distance between the first lead pattern part and the second lead pattern part. Accordingly, it is possible to minimize noise generation while improving the mobility of the image sensor substrate.

In addition, according to an embodiment, by preventing the elastic member and the extension pattern part from being aligned with each other in the vertical direction, it is possible to solve an electrical reliability problem that may occur due to a contact between the elastic member and the extension pattern part.

In addition, in the insulating layer in the embodiment, an extension insulating part having a spring shape is disposed in a region that vertically overlaps with the extension pattern part, so that the spring plate can be removed. Accordingly, the camera module may move the image sensor with respect to the lens barrel while elastically supporting the image sensor more stably, and may minimize the product volume.

In addition, in the embodiment, the width of the extension insulating part is greater than the width of the extension pattern part, so that the extension pattern part can be stably supported by the extension insulating part, and thus operation reliability can be improved.

In addition, in the embodiment, the first driving part composed of a permanent magnet is disposed so that the same poles are adjacent to each other with respect to the center, while the N poles and the S poles of the permanent magnets adjacent to each other are perpendicular to each other. According to this, in the embodiment, it is possible to secure the arrangement freedom of the second driving part and the third driving part for adjusting the electromagnetic force in response to the permanent magnet, it is possible to move in the X-axis and Y-axis, and stable tilt control is also possible.

DESCRIPTION OF DRAWINGS

FIG. 1 is a view showing a camera module according to a comparative example.

FIG. 2 is a view showing a camera device according to an embodiment.

FIG. 3 is a view showing a spring plate shown in FIG. 2.

FIG. 4 is a view showing first and second bonding sheets shown in FIG. 2.

FIG. 5 is a view showing an insulating layer according to an embodiment.

FIG. 6 is a view showing a conductive pattern portion according to an embodiment.

FIG. 7 is a plan view of an image sensor substrate according to an embodiment.

FIG. 8 is a view showing an arrangement structure of a first driving part according to an embodiment.

FIG. 9 is a view showing an arrangement structure of a second driving part according to an embodiment.

FIG. 10 is a view showing an arrangement structure of a third driving part according to an embodiment.

FIG. 11 is a view showing an arrangement structure of a third driving part according to another embodiment.

FIG. 12 is a view showing an arrangement structure of a third driving part according to another embodiment.

FIG. 13 is a view showing illustrating a connection structure between a flexible circuit board and an image sensor substrate according to an embodiment.

FIG. 14 is a view for explaining in detail a layer structure of a conductive pattern portion according to an embodiment.

FIG. 15 is a view showing a camera module according to another embodiment.

FIG. 16 is a view showing a camera device according to another exemplary embodiment.

FIG. 17 is a view showing an insulating layer shown in FIG. 16.

FIG. 18 is a view showing a second bonding sheet shown in FIG. 16.

FIG. 19 is a view showing a conductive pattern portion according to an embodiment.

FIG. 20 is a plan view of an image sensor substrate according to another embodiment.

FIG. 21 is a view showing an arrangement structure of a first driving part according to another embodiment.

BEST MODE

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (a), and (b) may be used.

These terms are only used to distinguish the elements from other elements, and the terms are not limited to the essence, order, or order of the elements. In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Hereinafter, embodiments of the present disclosure will be described in detail with reference to the accompanying drawings.

FIG. 1 is a view showing a camera module according to a comparative example.

A camera module having an optical image stabilizer (OIS) function and an Auto Focusing (AF) function requires at least two spring plates.

The camera module according to the comparative example may have two spring plates. The camera module according to the comparative example requires an elastic member such as at least six springs for the spring plate.

Referring to FIG. 1, the camera module according to the comparative example includes an optical system including a lens assembly, an infrared cut-off filter, and a sensor unit. That is, the camera module according to the comparative example includes a lens barrel 10, a lens assembly 20, a first elastic member 31, a second elastic member 32, a first housing 41, a housing 42, an infrared cut-off filter 50, a sensor unit 60, a circuit board 80, and driving parts 71, 72, 73, and 74.

In this case, the lens barrel 10 is connected to the first housing 41. That is, the lens barrel 10 is connected to the first housing 41 via the first elastic member 31. That is, the lens barrel 10 is connected to the first housing 41 so as to be movable by the first elastic member 31. In this case, the first elastic member 31 includes a plurality of springs (not shown). For example, the first elastic member 31 connects between the lens barrel 10 and the first housing 41 at a plurality of points of the lens barrel 10.

The second elastic member 32 is connected to the first housing 41 and the second housing 42 accommodating the first housing 41. The second elastic member 32 fixes the first housing 41 to the second housing 42 so as to be movable. The second elastic member 32 includes a plurality of springs. In detail, the second elastic member 32 includes a plate-shaped spring.

In this case, the first elastic member 31 moves the lens barrel 10 relative to the sensor unit 60 in a vertical direction (a Z-axis direction) while supporting the lens barrel 10. To this end, the first elastic member 31 includes at least four springs.

In addition, the second elastic member 32 moves the lens barrel 10 relative to the sensor unit 60 in a horizontal direction (an X-axis direction and a Y-axis direction) while supporting the lens barrel 10. To this end, the second elastic member 32 includes at least two springs.

As described above, in the camera module according to the comparative example, OIS and AF are performed as the lens barrel 10 moves in the X-axis, Y-axis, and Z-axis directions. To this end, the camera module according to the comparative example requires at least six elastic members such as springs. In addition, the camera module according to the comparative example requires two spring plates for supporting the elastic member as described above. Further, the camera module according to the comparative example requires an additional member such as an elastic wire for fixing the Z-axis of the lens barrel 10. Therefore, the camera module according to the comparative example has a complicated spring structure for moving the lens barrel in the X-axis, Y-axis and Z-axis directions.

In addition, in the camera module according to the comparative example, it is necessary to manually perform an operation of bonding the respective elastic members in order to couple the elastic member with the lens barrel 10. Accordingly, the camera module according to the comparative example has a complicated manufacturing process and requires a long manufacturing time.

In addition, the camera module according to the comparative example provides a tilt function of the lens barrel 10, but has a structure in which tilt correction of an image is substantially difficult. That is, even though the lens barrel 10 rotates with respect to the sensor unit 60, an image incident on the sensor unit 60 does not change, and thus the tilt correction of the image is difficult, and further, the tilt function itself is unnecessary.

Hereinafter, a substrate for an image sensor, a camera module, and a camera device including the same according to an embodiment will be described.

FIG. 2 is a view showing a camera device according to an embodiment.

Referring to FIG. 2, the camera device according to the embodiment includes a lens barrel 100, a lens assembly 200, a housing 300, an infrared cut filter part 400, driving parts 510, 520, 530, an image sensor substrate 600, an image sensor 700, and a flexible circuit board 800.

The lens barrel 100 accommodates the lens assembly 200.

The lens barrel 100 may include a receiving groove for accommodating the lens assembly 200. The receiving groove may have a shape corresponding to the lens assembly 200.

The lens barrel 100 may have a rectangular tube shape or a cylindrical shape. That is, the outer periphery of the lens barrel 100 may have a rectangular tube shape or a cylindrical shape, but the embodiment is not limited thereto.

The lens barrel 100 is connected to the housing 300. The lens barrel 100 is accommodated in the housing 300. The lens barrel 100 may be coupled to the housing 300 by a separate coupling member (not shown).

The lens barrel 100 may include an open region in an upper part thereof. Preferably, the lens barrel 100 may include a light entrance groove that is open to an object side. The light entrance groove may expose the lens assembly 200. In addition, an image may be incident on the lens assembly 200 via the light entrance groove.

The lens assembly 200 is disposed in the lens barrel 100. The lens assembly 200 is accommodated in the accommodating groove provided in the lens barrel 100. The lens assembly 200 may be inserted into and fixed to the accommodating groove of the lens barrel 100. The lens assembly 200 may have a circular outer shape. For example, the lens assembly 200 may have a circular shape when viewed from a top side, but the embodiment is not limited thereto. That is, the lens assembly 200 may have a rectangular shape when viewed from the top side.

The lens assembly 200 includes a plurality of lenses. For example, the lens assembly 200 may include first to fourth lenses. The first to fourth lenses may be sequentially stacked. In addition, a spacer (not shown) may be interposed between the lenses. The spacer may space a distance between the lenses constant. In the above, the lens assembly 200 has been described as including four lenses, but the embodiment is not limited thereto. For example, the lens assembly 200 may include one to three lenses, or may include five or more lenses.

The housing 300 accommodates the lens barrel 100. The housing 300 fixes a position of the lens barrel 100 via a separate fixing member (not shown). That is, according to the comparative example, the lens barrel is coupled to be movable with respect to the housing. Unlike this, in an embodiment, the housing 300 may be firmly fixed via the fixing member such that the lens barrel 100 does not move in the housing 300. Accordingly, the position of the lens barrel 100 in the housing 300 is always fixed. Accordingly, in the embodiment, since the lens barrel 100 is always fixed at the same position, it is possible to solve a problem of distortion of an optical axis caused by warping of the lens barrel, etc., thereby improving reliability The housing 300 may be formed of plastic or metal. The housing 300 may have a rectangular tube shape.

The infrared cut-off filter part 400 may be disposed at a lower end of the lens barrel 100. The infrared cut-off filter part 400 may be fixedly disposed on a separate substrate (not shown), and accordingly, it may be coupled to the lens barrel 100. The infrared cut-off filter part 400 may block light having an excessive long wavelength flowing into the image sensor 700.

The infrared cut-off filter 400 may be formed by alternately depositing titanium oxide and silicon oxide on an optical glass. In this case, thicknesses of the titanium oxide and the silicon oxide constituting the infrared cut-off filter 400 may be appropriately adjusted in order to block infrared rays.

The driving parts 510, 520, and 530 move the image sensor substrate 600 relative to the fixed lens barrel 100. The driving parts 510, 520, and 530 move the image sensor substrate 600 relative to the fixed housing 300. The driving part 510, 520, and 530 move the image sensor substrate 600 with respect to the fixed lens assembly 200.

To this end, the driving parts 510, 520, and 530 may move the image sensor substrate 600 relative to magnetic force. The driving parts 510, 520, and 530 may include a first driving part 510, a second driving part 520, and a third driving part 530.

The first driving part 510 is attached to the image sensor substrate 600. Preferably, the first driving part 510 may be attached to a lower surface of the image sensor substrate 600. More preferably, the first driving part 510 may be attached to a lower surface of the insulating layer 610 constituting the image sensor substrate 600. The first driving part 510 may include a magnet. For example, the first driving part 510 may include a permanent magnet. In this case, the magnet constituting the first driving part 510 may have a plate shape. Accordingly, the first driving part 510 may include an upper surface, a lower surface, and side surfaces.

The second driving part 520 may be disposed on a bottom surface of the housing 300. Preferably, the second driving part 520 may be disposed on the bottom surface of the housing 300 overlapped with the image sensor substrate 600 in a vertical direction. The second driving part 520 may include a coil. The second driving part 520 may receive a driving signal and generate a magnetic field according to the driving signal.

In this case, the first driving part 510 and the second driving part 520 may face each other. That is, the first driving part 510 and the second driving part 520 may be disposed to be overlapped with each other in the vertical direction. The first driving part 510 and the second driving part 520 may be disposed side by side in the horizontal direction. That is, the lower surface of the first driving part 510 and an upper surface of the second driving part 520 may be disposed to face each other. A separation distance between the first driving part 510 and the second driving part 520 may be 50 μm to about 1000 μm, but the embodiment is not limited thereto A magnetic force may be generated between the first driving part 510 and the second driving part 520. Accordingly, the image sensor substrate 600 may move in a X-axis direction and a Y-axis direction by a force generated between the second driving part 520 and the first driving part 510. Preferably, the image sensor substrate 600 may move in the X-axis direction or the Y-axis direction according to the direction of the current applied to the second driving part 520. Also, the image sensor substrate 600 may be tilted (or rotated) according to the direction of the current applied to the second driving part 520. To this end, the second driving part 520 and the first driving part 510 may include a plurality of magnets and a plurality of coils, respectively.

That is, the first driving part 510 may include a plurality of magnets spaced apart from each other by a predetermined interval. In addition, the second driving part 520 may include a plurality of coils overlapping each of the plurality of magnets constituting the first driving part 510 in the vertical direction.

According to an exemplary embodiment, the third driving part 530 may be attached to the image sensor substrate 600. Preferably, the third driving part 530 may be attached to a sidewall of the image sensor substrate 600. Specifically, the third driving part 530 may be attached to a side surface of a support layer 660 of the image sensor substrate 600. In this case, at least a part of the third driving part 530 may be disposed to overlap the first driving part 510 in the horizontal direction. The third driving part 530 may be disposed perpendicular to the first driving part 510. That is, an upper surface of the third driving part 530 may be disposed to face a side surface of the first driving part 510. Accordingly, the image sensor substrate 600 may move in the Z-axis direction by the force between the third driving part 530 and the first driving part 510. In this case, the third driving part 530 may be disposed in a region overlapping the first driving part 510 in the horizontal direction. That is, the third driving part 530 may include a coil wound around the support layer 660.

In addition, in another embodiment, the third driving part 530 may be arranged to overlap and align with at least a part of the first driving part 510 in a vertical direction. In this case, the third driving part 530 may be formed of an electromagnet. That is, the third driving part 530 formed of an electromagnet generates attractive or repulsive force to the first driving part 510, so that the image sensor substrate 600 can be moved upward or downward in a Z-axis.

That is, the second driving part 520 may be disposed to move the first driving part 510 in a left direction, a right direction, or rotationally. Also, the third driving part 530 may be disposed to move the first driving part 510 in an upward direction or a downward direction.

An arrangement structure of the first to third driving parts and an operation thereof will be described in detail below.

The image sensor substrate 600 is a substrate on which the image sensor 700 is mounted. In detail, the image sensor substrate 600 may be driven by the driving parts 510, 520, and 530 to move the image sensor 700 in the X, Y, and Z-axis directions. In addition, the image sensor substrate 600 may be driven by the driving parts 510, 520, and 530 to tilt the image sensor 700.

The image sensor substrate 600 may be disposed to be spaced apart from the bottom surface of the housing 300 by a predetermined distance. In addition, the image sensor substrate 600 may move the mounted image sensor 700 with respect to the housing 300.

To this end, the image sensor substrate 600 may include a spring plate 610, a first bonding sheet 620, an insulating layer 630, a conductive pattern portion 650, and a support layer 660, but is not limited thereto. That is, a second bonding sheet 640 may be further selectively formed between the insulating layer 630 and the conductive pattern portion 650. Accordingly, the conductive pattern portion 650 may be directly formed on the insulating layer 630, or alternatively, it may be formed on the second bonding sheet 640. Also, when the second bonding sheet 640 is formed, the second bonding sheet 640 may have a shape corresponding to the conductive pattern portion 650. That is, the second bonding sheet 640 may be a seed layer of the conductive pattern portion 650. Accordingly, when the conductive pattern portion 650 is patterned, the second bonding sheet 640 may also be removed together with the conductive pattern portion 650, and accordingly, the second bonding sheet 640 may have the same shape as the conductive pattern part 650. That is, a planar area of the second bonding sheet 640 may be the same as a planar area of the conductive pattern portion 650.

As a result, the second bonding sheet 640 may be removed, but may be formed between the insulating layer and the conductive pattern portion in some cases. In addition, when the second bonding sheet is formed, the planar area of the second bonding sheet may have the same planar area as the planar area of the conductive pattern portion 650. Also, in some cases, a planar area of the second bonding sheet may be the same as a planar area of the insulating layer. Hereinafter, it will be described assuming that the second bonding sheet is included.

The spring plate 610 supports the insulating layer 630 and the conductive pattern portion 650 constituting the image sensor substrate 600, and to move the image sensor 700 disposed on the image sensor substrate 600 in X-axis, Y-axis, and Z-axis directions. To this end, the spring plate 610 may include at least one elastic member. Preferably, the spring plate 610 may include a plurality of elastic members. For example, the spring plate 610 may include four elastic members.

The spring plate 610 may be formed of a metal material such as stainless steel (STS) or invar, but is not limited thereto. For example, the spring plate 610 may be formed of another metal material of a spring material having an elastic force in addition to the above material. That is, the spring plate 610 may have a certain elastic force, accordingly, while elastically supporting the substrate 600 for the image sensor, the image sensor substrate 600 may be moved in the X-axis, Y-axis, and Z-axis directions.

An insulating layer 630 is disposed on the spring plate 610. In this case, the first bonding sheet 620 may be disposed between the spring plate 610 and the insulating layer 630. The first bonding sheet 620 may be disposed between the spring plate 610 and the insulating layer 630 to provide adhesion. That is, the first bonding sheet 620 may fix the insulating layer 630 on the spring plate 610. To this end, the first bonding sheet 620 may be formed of a double-sided adhesive film. The first bonding sheet 620 may be formed of an epoxy or acrylic adhesive.

An insulating layer 630 is disposed on the first bonding sheet 620. That is, the insulating layer 630 may be attached to the spring plate 610 by the first bonding sheet 620.

The insulating layer 630 is a substrate for forming the conductive pattern portion 650. The insulating layer 630 may include all of a printed circuit board, a wiring board, and an insulating substrate made of an insulating material capable of forming the conductive pattern portion 650 on the surface.

The insulating layers 610 may be rigid or flexible. For example, the insulating layer 610 may include glass or plastic. Specifically, the insulating layer 610 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the insulating layer 610 may include an optically isotropic film. For example, the insulating layer 610 may include cyclic olefin copolymer (COC), cyclic olefin polymer (COP), optically isotropic PC, optically isotropic polymethylmethacrylate (PMMA), etc.

In this case, the insulating layer 610 may be partially bent while having a curved surface. That is, the insulating layer 610 may partially have a plane and may partially be bent while having a curved surface. In addition, the insulating layer 610 may be a flexible substrate having flexibility. Further, the insulating layer 610 may be a curved or bended substrate.

A conductive pattern portion 650 is disposed on the insulating layer 630. The conductive pattern portion 650 may include a lead pattern part spaced apart from each other by a predetermined distance on the insulating layer 630. For example, the conductive pattern portion 650 may include a first lead pattern part connected to the image sensor 700 and a second lead pattern part connected to the flexible circuit board 800. In addition, the conductive pattern portion 650 may include an extension pattern part connecting the first lead pattern part and the second lead pattern part. The first lead pattern part, the second lead pattern part, and the extension pattern part will be described in detail below.

The conductive pattern portion 650 is a wiring for transmitting an electrical signal, and may be formed of a metal material having high electrical conductivity. For this, the conductive pattern part 640 may be formed of at least one metal material selected from among gold (Au), silver (Ag), platinum (Pt), titanium (Ti), tin (Sn), copper (Cu), and zinc (Zn). In addition, the circuit pattern 112 may be formed of paste or solder paste including at least one metal material selected from among gold (Au), silver (Ag), platinum (Pt), titan Preferably, the conductive pattern portion 650 serves as a wiring for transmitting an electrical signal, and may be formed of a metallic material having an elastic force movable in the X-axis, Y-axis, and Z-axis directions by interlocking with the elastic member of the siring plate 610. To this end, the conductive pattern portion 650 may be formed of a metal material having a tensile strength of 1000 MPa or more. For example, the conductive pattern portion 650 may be a binary alloy or ternary alloy containing copper. For example, the conductive pattern portion 650 may be a binary alloy of copper (Cu)-nickel (Ni). For example, the conductive pattern portion 650 may be a binary alloy of copper (Cu)-tin (Sn). For example, the conductive pattern portion 650 may be a binary alloy of copper (Cu)-beryllium (Be). For example, the conductive pattern portion 650 may be a binary alloy of copper (Cu)-cobalt (Co). For example, the conductive pattern portion 650 may be a ternary alloy of copper (Cu)-nickel (Ni)-tin (Sn). For example, the conductive pattern portion 650 may be a ternary alloy of copper (Cu)-beryllium (Be)-cobalt (Co). In addition, in addition to the metal material, the conductive pattern portion 650 may be formed of an alloy of iron (Fe), nickel (Ni), zinc (Zn), and the like having an elastic force capable of acting as a spring and having good electrical characteristics. Further, the conductive pattern portion 650 may be surface-treated with a plating layer containing a metal material such as gold (Au), silver (Ag), palladium (Pd), and the like, thereby improving electrical conductivity.

On the other hand, the conductive pattern portion 650 is a typical printed circuit board manufacturing process additive process (Additive process), subtractive process (Subtractive Process), MSAP (Modified Semi Additive Process) and SAP (Semi Additive Process) method and the like, and a detailed description thereof will be omitted here.

The support layer 660 may be a support substrate. A third driving part 530 may be mounted on the support layer 660, and thus an electric signal may be applied to the third driving part 530. The support layer 660 may support the spring plate 610. Preferably, the support layer 660 may support the spring plate 610, the first bonding sheet 620, the second bonding sheet 640, and the insulating layer 630, the conductive pattern portion 650 and the image sensor 700 at a position floating from the bottom surface of the housing 300. The support layer 660 may be a substrate on which the third driving part 530 according to an embodiment is disposed.

The image sensor 700 is disposed on the image sensor substrate 600. Preferably, the image sensor 700 is disposed on the conductive pattern portion 650 of the image sensor substrate 600. The image sensor 700 may be mounted on the first lead pattern part constituting the conductive pattern portion 650 of the image sensor substrate 600.

The image sensor 700 may be composed of a charge coupled device (CCD) or a complementary metal oxide semiconductor (CMOS) sensor, and may be a device that outputs a photographed object using a photoelectric conversion element and a charge coupled element as an electrical signal. The image sensor 700 may be electrically connected to the conductive pattern portion 650 on the image sensor substrate 600, and receive an image provided from the lens assembly 200. In addition, the image sensor 700 may convert the received image into an electrical signal and output the electrical signal. In this case, a signal output through the image sensor 700 may be transmitted to the flexible circuit board 800 via the conductive pattern portion 650.

One end of the flexible circuit board 800 may be connected to the image sensor substrate 600. The flexible circuit board 800 may receive an electrical signal output from the image sensor 700. The flexible circuit board 800 may have a connector at the other end. A main board (not shown) may be connected to the connector.

That is, the flexible circuit board 800 may connect the camera module and the main board of the external device. Specifically, the flexible circuit board 800 may connect between the conductive pattern portion 650 of the image sensor substrate 600 of the camera module and the main substrate of the portable terminal.

To this end, a region of the flexible circuit board 800 is disposed inside the housing 300, and accordingly, may be connected to the conductive pattern portion 650 of the image sensor substrate 600.

Hereinafter, the image sensor substrate 600 according to an embodiment will be described in more detail.

FIG. 3 is a view showing the spring plate shown in FIG.

Referring to FIG. 3, the spring plate 610 may elastically support the insulating layer 630 and the conductive pattern portion 650 constituting the image sensor substrate 600.

The spring plate 610 may move the image sensor 700 disposed on the image sensor substrate 600 in the X-axis, Y-axis, and Z-axis directions.

To this end, the spring plate 610 may be formed of a material having elasticity. Specifically, the spring plate 610 may include a plurality of elastic members having elastic force. For example, the spring plate 610 may include four elastic members 614, 615, 616, and 617.

The spring plate 610 may be formed of a metal material such as stainless steel (STS) or invar, but the embodiment is not limited thereto. For example, the spring plate 610 may be formed of another metal material of a spring material having elastic force in addition to the material. That is, the spring plate 660 may have a predetermined elastic force, and accordingly, the spring plate 610 may move the image sensor substrate 600 in the X-axis, Y-axis, and Z-axis directions while elastically supporting the image sensor substrate 600.

The spring plate 610 may include a first plate part 611, a second plate part 612, and elastic members 614, 615, 616, and 617.

Specifically, the spring plate 610 may have a first plate part 611 disposed at the center thereof. In addition, the second plate part 612 may be disposed surrounding the first plate part 611 at a position spaced apart from the first plate part 611 by a predetermined distance.

That is, the spring plate 610 may include the first plate part 611 and the second plate part 612. And, an open region 613 is formed between the first plate part 611 and the second plate part 612. Preferably, the first plate part 611 and the second plate part 612 may be separated from each other.

The elastic members 614, 615, 616, and 617 may have one end connected to the first plate part 611 and the other end connected to the second plate part 612. To this end, the elastic members 614, 615, 616, 617 may include a first elastic member 614, a second elastic member 615, a third elastic member 616, and a fourth elastic member 617.

The first elastic member 614 may connect a first corner region of the first plate part 611 and a first corner region of the second plate part 612. The first elastic member 614 has one end connected to the first corner region of the first plate part 611 and the other end connected to the first corner region of the second plate part 612. And, the first elastic member 614 may elastically connect them. The first corner region may be a corner portion located at an upper left of each plate.

The second elastic member 615 may connect a second corner region of the first plate part 611 and a second corner region of the second plate part 612. The second elastic member 615 has one end connected to the second corner region of the first plate part 611 and the other end connected to the second corner region of the second plate part 612. And, the second elastic member 615 may elastically connect them. The second corner region may be a corner portion located at an upper right of each plate.

The third elastic member 616 may connect a third corner region of the first plate part 611 and a third corner region of the second plate part 612. The third elastic member 616 has one end connected to the third corner region of the first plate part 611 and the other end connected to the third corner region of the second plate part 612. And, the third elastic member 616 may elastically connect them. The third corner region may be a corner portion located at the lower left of each plate.

The fourth elastic member 617 may connect a fourth corner region of the first plate part 611 and a fourth corner region of the second plate part 612. The fourth elastic member 617 has one end connected to the fourth corner region of the first plate part 611 and the other end connected to the fourth corner region of the second plate part 612. And, the fourth elastic member 617 may elastically connect them. The fourth corner region may be a corner portion located at the lower right of each plate.

Meanwhile, in the drawings, each of the first plate part 611, the second plate part 612, and the elastic members 614, 615, 616, and 617 is illustrated as being configured separately, but is not limited thereto. That is, the first plate part 611, the second plate part 612, and the elastic members 614, 615, 616, and 617 may be integrally formed with each other. That is, the spring plate 610 may form an open region 613 on the plate of the plate-like member in the remaining portions except for portions corresponding to the elastic members 614, 615, 616, and 617.

Such the spring plate 610 may have a thickness of 10 μm to 100 μm. For example, the spring plate 610 may have a thickness of 20 μm to 70 μm. For example, the spring plate 610 may have a thickness of 40 μm to 50 μm. When the thickness of the spring plate 660 exceeds 100 μm, a thickness of the image sensor substrate 600 may increase. In addition, when the thickness of the spring plate 610 is smaller than 10 μm, a stress generated during movement of the image sensor substrate 600 may not be sufficiently maintained. Preferably, the spring plate 610 is set to have a thickness of 50 μm±10 μm to maintain a stress of 600 MPa or more.

In addition, the elastic members 614, 615, 616, and 617 have a length equal to or greater than a predetermined level. When the length of the elastic members 614, 615, 616, and 617 is too long, there is a problem that a volume of the spring plate 610 becomes large, and when the length of the elastic members 614, 615, 616, and 617 is too short, it may not be possible to stably and elastically support the image sensor substrate 600. Therefore, the elastic members 614, 615, 616, and 617 have a length of 50 μm to 100 μm. At this time, the length of the elastic members 614, 615, 616, and 617 is larger than the width of the open region 613. That is, the elastic members 614, 615, 616, and 617 may be formed to have a shape of a plurality of bent springs in the open region 613.

In addition, a plurality of slits 618 are formed in the first plate part 611. The plurality of slits 618 may be spaced apart from each other by a predetermined distance on the first plate part 61. The plurality of slits 618 may be formed for reducing a weight of the spring plate 610. In addition, the plurality of slits 618 may be formed for flatness of the spring plate 610. That is, the insulating layer 630, the conductive pattern portion 650, and the image sensor 700 are disposed on the first plate part 611. The first driving part is disposed below the first plate part 611. In this case, flatness of the first driving part or the image sensor 700 directly affects the reliability of the camera module, and the image quality may be deteriorated as the flatness is worsen. Therefore, in the embodiment, not only the weight of the spring plate 610 may be reduced but also the flatness may be maintained by forming the plurality of slits 618 in the first plate part 611, thereby improving overall reliability of the camera module.

In addition, a plurality of driving part mounting grooves (not shown) may be formed on a lower surface of the first plate part 611. The plurality of driving part mounting grooves may be formed by removing a part of the lower surface of the first plate part 611, for maintaining the flatness of the first driving part 510 attached to the lower surface of the first plate part 611, FIG. 4 is a view showing the first and second bonding sheets shown in FIG. 2.

Referring to FIG. 4, a first bonding sheet 620 is disposed on the spring plate 610. In this case, the first bonding sheet 620 has a planar shape corresponding to the planar shape of the spring plate 610.

That is, the first bonding sheet 620 includes a first bonding part 621 disposed on the first plate part 611 of the spring plate 610 and a second bonding part 622 disposed on the second plate part 612 of the spring plate 610. In addition, the first bonding sheet 620 may include an open region 623 between the first bonding part 621 and the second bonding part 622.

The second bonding part 622 is disposed surrounding the first bonding part 621 at a position spaced apart from the first bonding part 621 by a predetermined distance. In this case, the second bonding part 622 does not directly contact the first bonding part 621. Accordingly, the first bonding part 621 and the second bonding part 622 may be separated from each other through the open region 623.

Meanwhile, the open region 623 of the first bonding sheet 620 may overlap the open region 613 of the spring plate 610 in a vertical direction. Preferably, a planar area of the open region 623 of the first bonding sheet 620 may be the same as a planar area of the open region 613 of the spring plate 610. In addition, the first bonding sheet 620 does not overlap with the elastic members 614, 615, 616, 617 of the spring plate 610 in the vertical direction. Accordingly, the first plate part 611 and the second plate part 612 may be covered by the first bonding sheet 620, and the elastic members 614, 615, 616, and 617 may be exposed by the open region 623 of the first bonding sheet 620.

The first bonding sheet 620 may be formed of a double-sided adhesive film. The first bonding sheet 620 may be formed of an epoxy or acrylic adhesive or a thermosetting adhesive film.

The first bonding sheet 620 may have a thickness of 25 μm.

FIG. 5 is a view showing an insulating layer according to an embodiment.

Referring to FIG. 5, the insulating layer 630 is disposed on the first bonding sheet 620. The insulating layer 630 may have a planar shape corresponding to the planar shape of the first bonding sheet 620.

That is, the insulating layer 630 may include a first insulating part 631 disposed on the first bonding part 621 and a second insulating part 632 disposed on the second bonding part 622. In addition, the insulating layer 630 may include an open region 633 between the first insulating part 631 and the second insulating part 632.

The second insulating part 632 is disposed surrounding the first insulating part 631 at a position spaced apart from the first insulating part 631 by a predetermined distance. In this case, the second insulating part 632 does not directly contact the first insulating part 631. Accordingly, the first insulating part 631 and the second insulating part 632 may be separated from each other through the open region 633.

Meanwhile, the open region 633 of the insulating layer 630 may overlap the open region 613 of the spring plate 610 in a vertical direction. Preferably, a planar area of the open region 633 of the insulating layer 630 may be the same as the planar area of the open region 613 of the spring plate 610. In addition, the insulating layer 630 does not overlap with the elastic members 614, 615, 616, 617 of the spring plate 610 in the vertical direction. That is, the elastic members 614, 615, 616, and 617 may be exposed through the open region 623 of the first bonding sheet 620 and the open region 633 of the insulating layer 630.

The insulating layer 630 may have a thickness of 20 µm to 100 µm. For example, the insulating layer 630 may have a thickness of 25 µm to 50 µm. For example, the insulating layer 630 may have a thickness of 30 µm to 40 µm. When the thickness of the insulating layer 630 exceeds 100 µm, the overall thickness of the image sensor substrate 600 may increase. When the thickness of the insulating layer 630 is less than 20 µm, it may be difficult to dispose the image sensor 700. When the thickness of the insulating layer 630 is less than 20 µm, it may be weak against heat/pressure, or the like in a process of mounting the image sensor, and thus it may be difficult to mount the image sensor 700 stably.

Meanwhile, a second bonding sheet 640 is disposed on the insulating layer 630.

The second bonding sheet 640 has the same structure as the first bonding sheet 620. Compared to the first bonding sheet 620, the second bonding sheet 640 differs only in an arrangement position. Accordingly, a detailed description of the second bonding sheet 640 will be omitted. Meanwhile, although not shown in the drawing, the second bonding sheet 640 also includes an open region like the first bonding sheet 620 or the insulating layer 630, and accordingly, the elastic members 614, 615, 616, 617 is exposed.

Meanwhile, in the insulating layer 630 in the first embodiment, the first insulating part and the second insulating part are separated from each other. That is, the open region 633 of the insulating layer 630 is disposed to surround the entire circumference of the first insulating part 631.

On the other hand, the open region 633 of the insulating layer 630 may be disposed partially surrounding the first insulating part 631.

FIG. 6 is a view showing a conductive pattern portion according to an embodiment.

Referring to FIG. 6 the conductive pattern portion 650 may be disposed on the insulating layer 630 with a specific pattern. The conductive pattern portion 650 includes a first conductive pattern part 651 disposed on a first region of the insulating layer 630, a second conductive pattern part 652 disposed on a second region of the insulating layer 630, a third conductive pattern part 653 disposed on a third region of the insulating layer 630, and a fourth conductive pattern part 654 disposed on a fourth region of the insulating layer 630.

The first conductive pattern part 651 may be disposed on a left side of an upper surface of the insulating layer 630. That is, the first conductive pattern part 651 may be disposed on a left region of the first insulating part 631, a left region of the second insulating part 632, and a left region of the open region 633.

The second conductive pattern art 652 may be disposed in a right region of the upper surface of the insulating layer 630. That is, the second conductive pattern part 652 may be disposed on a right region of the first insulating part 631, a right region of the second insulating part 632, and a right region of the open region 633.

The third conductive pattern part 653 may be disposed in an upper region of the upper surface of the insulating layer 630. That is, the third conductive pattern part 653 may be disposed on an upper region of the first insulating part 631, an upper region of the second insulating part 632, and an upper region of the open region 633.

The fourth conductive pattern part 654 may be disposed in a lower region of the upper surface of the insulating layer 630. That is, the fourth conductive pattern part 654 may be disposed on a lower region of the first insulating part 631, a lower region of the second insulating part 632, and a lower region of the open region 633.

As described above, the conductive pattern portion 650 are disposed on different regions, and accordingly, the elastic support force in the movement of the image sensor substrate 600 may be increased. That is, when the conductive pattern portion 650 is intensively disposed only in a specific region, reliability in moving the image sensor substrate 600 in a specific direction may be reduced. For example, when the conductive pattern portion 650 includes only the first and second conductive pattern parts, there is no problem with the movement of the image sensor substrate 600 in the X-axis direction, stability may be deteriorated when the image sensor substrate 600 moves in the Y-axis direction. In addition, in this case, the conductive pattern portion 650 may be disconnected according to the periodic movement of the image sensor substrate 600. Accordingly, in the embodiment, the conductive pattern portion 650 is distributed in each of the four regions as described above, so that the image sensor substrate 600 can be stably moved in the X-axis, Y-axis, and Z-axis.

Meanwhile, the conductive pattern portion 650 may include a first lead pattern part 655 connected to the image sensor 700 and a second lead pattern part 656 connected to the flexible circuit board 800. In addition, the conductive pattern portion 650 may include an extension pattern part 657 connecting the first lead pattern part 655 and the second lead pattern part 656 to each other.

The first lead pattern part 655 is disposed on the first insulating part 631 of the insulating layer 630. The first lead pattern part 655 may be disposed in an outer region of the first insulating part 631. That is, the image sensor mounting region on which the image sensor 700 is mounted may be formed in the first insulating part 631. In this case, the image sensor mounting region may be a central region of the first insulating part 631. Accordingly, the first lead pattern part 655 may be disposed around the image sensor mounting region of the first insulating part 631.

The second lead pattern part 656 is disposed on the second insulating part 632 of the insulating layer 630. The second lead pattern parts 656 may be respectively disposed on the second insulating part 632. In this case, the first lead pattern part 655 and the second lead pattern part 656 may be disposed to face each other on the first insulating part 631 and the second insulating part 632. That is, the number of first lead pattern parts 655 may be the same as the number of second lead pattern parts 656. In addition, the first lead pattern parts 655 may be disposed to face the second lead pattern part 656, respectively.

Meanwhile, the extension pattern part 657 may be disposed between the first lead pattern part 655 and the second lead pattern part 656.

The extension pattern part 657 may have one end connected to the first lead pattern part 655 and the other end connected to the second lead pattern part 656 facing the first lead pattern part 655.

In this case, the extension pattern part 657 may be disposed on the open region of the insulating layer 630. Accordingly, the extension pattern part 657 may be disposed to float in the open region of the insulating layer, the open region of the first bonding sheet, the open region of the second bonding sheet, and the open region of the spring plate 610. Here, the meaning that the extension pattern part 657 is floating means that there is no support part supporting the extension pattern part 657 at the bottom. Accordingly, the extension pattern part 657 may be disposed in a state floating in the air.

A length of the extension pattern part 657 is greater than a linear distance between the first lead pattern part 655 and the second lead pattern part 656. That is, the extension pattern part 657 may be formed to have a structure that is bent a plurality of times between the first lead pattern part 655 and the second lead pattern part 656. Preferably, the extension pattern part 657 may be formed in a spring shape between the first lead pattern part 655 and the second lead pattern part 656.

At this time, the extension pattern part 657 may be formed by etching to have the above shape through an additive process, a subtractive process, a modified semi-additive process (MSAP), a semi-additive process (SAP), and the like. Preferably, the extension pattern part 657 may be formed simultaneously with the first lead pattern part 655 and the second lead pattern part 656. More preferably, the extension pattern part 657 may be integrally formed with the first lead pattern part 655 and the second lead pattern part 656.

Meanwhile, the thickness of the conductive pattern portion 650 including the extension pattern part 657, the first lead pattern part 655, and the second lead pattern part 656 may be 10 μm to 50 μm. For example, the thickness of the conductive pattern portion 650 may be 30 μm to 40 μm. In this case, when the thickness of the conductive pattern portion 650 is less than 10 μm, the conductive pattern portion 650 may be broken when the image sensor substrate 600 moves. In addition, when the thickness of the conductive pattern portion 650 is greater than 50 μm, elastic force of the extension pattern part 657 may be lowered, thereby hindering the mobility of the image sensor substrate 600. Accordingly, in the embodiment, the thickness of the conductive pattern portion 650 is set to be 35 μm±5 μm such that the image sensor substrate 600 may be stably moved.

In addition, the length of the extension pattern part 657 is set to have at least 1.5 times the linear distance between the first lead pattern part 655 and the second lead pattern part 656. In addition, the length of the extension pattern part 657 is set to be 20 times or less of the linear distance between the first lead pattern part 655 and the second lead pattern part 656. Preferably, the length of the extension pattern part 657 is set to be less than 4 times the linear distance between the first lead pattern part 655 and the second lead pattern part 656.

The linear distance between the first lead pattern part 655 and the second lead pattern part 656 may be 1.5 mm.

In this case, when the length of the extension pattern part 657 is smaller than 1.5 times the linear distance between the first lead pattern part 655 and the second lead pattern part, the mobility of the image sensor substrate 600 may be reduced due to the decrease in the elastic force of the extension pattern part 657. In addition, when the length of the extension pattern part 657 is greater than 20 times the linear distance, a resistance increases as a signal transmission distance is increased by the extension pattern part 657, and accordingly, noise may be included in a signal transmitted via the extension pattern part 657. Accordingly, in order to minimize noise generation, the length of the extension pattern part 657 is set to be 4 times or less the linear distance between the first lead pattern part 655 and the second lead pattern part 656.

In addition, the length of the extension pattern part 657 is smaller than the lengths of the elastic members 614, 615, 616, and 617.

Meanwhile, the conductive pattern portion 650 as described above is a wiring for transmitting an electrical signal, and may be formed of a metal material having high electrical conductivity. For this, the conductive pattern portion 650 may be formed of at least one metal material selected from among gold (Au), silver (Ag), platinum (Pt), titanium (Ti), tin (Sn), copper (Cu), and zinc (Zn). In addition, the conductive pattern portion 650 may be formed of paste or solder paste including at least one metal material selected from among gold (Au), silver (Ag), platinum (Pt), titanium (Ti), tin (Sn), copper (Cu), and zinc (Zn), which are excellent in bonding strength.

Preferably, the conductive pattern portion 650 serves as a wiring for transmitting an electrical signal, and may be formed of a metallic material having an elastic force movable in the X-axis, Y-axis, and Z-axis directions by interlocking with the elastic member. To this end, the conductive pattern portion 650 may be formed of a metal material having a tensile strength of 1000 MPa or more. For example, the conductive pattern portion 650 may be a binary alloy or ternary alloy containing copper. For example, the conductive pattern portion 650 may be a binary alloy of copper (Cu)-nickel (Ni). For example, the conductive pattern portion 650 may be a binary alloy of copper (Cu)-tin (Sn). For example, the conductive pattern portion 650 may be a binary alloy of copper (Cu)-beryllium (Be). For example, the conductive pattern portion 650 may be a binary alloy of copper (Cu)-cobalt (Co). For example, the conductive pattern portion 650 may be a ternary alloy of copper (Cu)-nickel (Ni)-tin (Sn). For example, the conductive pattern portion 650 may be a ternary alloy of copper (Cu)-beryllium (Be)-cobalt (Co). In addition, in addition to the metal material, the conductive pattern portion 650 may be formed of an alloy of iron (Fe), nickel (Ni), zinc (Zn), and the like having an elastic force capable of acting as a spring and having good electrical characteristics. Further, the conductive pattern portion 650 may be surface-treated with a plating layer containing a metal material such as gold (Au), silver (Ag), palladium (Pd), and the like, thereby improving electrical conductivity.

FIG. 7 is a plan view of an image sensor substrate according to an embodiment.

Referring to FIG. 7, the first bonding sheet 620 is disposed on the spring plate 610. In addition, the insulating layer 630 is disposed on the first bonding sheet 620. In addition, the second bonding sheet 630 is disposed on the insulating layer 630. In addition, the conductive pattern portion 650 is disposed on the second bonding sheet 630. In this case, the spring plate 610, the first bonding sheet 620, the insulating layer 630, and the second bonding sheet 630 each include an open region, and each of the open regions may overlap each other in a vertical direction. Therefore, the elastic members 614, 615, 616, 617 of the spring plate 610 disposed at a lowermost part may be exposed through the open regions of the spring plate 610, the first bonding sheet 620, the insulating layer 630, and the second bonding sheet.

The extension pattern part 657 of the conductive pattern portion 650 is also disposed on the open region of the spring plate 610, the first bonding sheet 620, the insulating layer 630, and the second bonding sheet 630.

That is, the elastic members 614, 615, 616, 617 of the spring plate 610 and the extension pattern part 657 of the conductive pattern portion 650 are disposed in the open regions of the spring plate 610, the first bonding sheet 620, and the insulating layer 630, and the second bonding sheet 630.

In this case, the elastic members 614, 615, 616, 617 of the spring plate 610 and the extension pattern part 657 of the conductive pattern portion 650 do not overlap each other in the vertical direction. For example, the elastic members 614, 615, 616, 617 of the spring plate 610 are disposed in a first region of the open regions of the spring plate 610, the first bonding sheet 620, the insulating layer 630, the second bonding sheet 630. And, the extension pattern part 657 of the conductive pattern portion 650 is disposed in a second region of the open regions of the spring plate 610, the first bonding sheet 620, the insulating layer 630, and the second bonding sheet 630. The first region of the open regions may be a corner region of the open regions, and the second region of the open regions may be a remaining region except for the corner region.

That is, the image sensor substrate 600 not only moves in the X-axis direction and the Y-axis direction, but also moves in the Z-axis direction. At this time, there is a difference between the elastic modulus of the elastic members 614, 615, 616, and 617 and the elastic modulus of the extension pattern part 657. Accordingly, when the image sensor substrate 600 moves in the Z-axis direction, the movement distances of the elastic members 614, 615, 616, 617 and the extension pattern part 657 appear different from each other. Accordingly, when the image sensor substrate 600 moves in the Z-axis direction, the elastic members 614, 615, 616, 617 and the extension pattern part 657 may contact each other. Accordingly, a problem (for example, a short) may occur in electrical reliability. Accordingly, in the embodiment, as described above, the elastic members 614, 615, 616, 617 and the extension pattern part 657 are not aligned with each other in the vertical direction. Thereby, the electrical reliability problem can be solved.

FIG. 8 is a view showing an arrangement structure of a first driving part according to an exemplary embodiment.

Referring to FIG. 8, the first driving part 510 may include a plurality of magnets. The first driving part 510 may include a first-first driving part 511, a first-second driving part 512, a first-third driving part 513, and a first-fourth driving part 514.

The first-first driving part 511 may be disposed in one region of the first plate part 611 of the spring plate 610. Preferably, the first-first driving part 511 may be disposed in a first corner region of the first plate part 611. For example, if the lower surface of the first plate part 611 is divided into four planes, the first-first driving part 511 may be disposed in a second quadrant. In this case, the first-first driving part 511 may be arranged such that the N pole and the S pole are arranged in a horizontal direction. For example, the first-first driving part 511 may be disposed under the lower surface of the first plate part 611 such that the N pole and the S pole are positioned in the X-axis direction.

The first-second driving part 512 may be disposed in one region of the first plate part 611 of the spring plate 610. Preferably, the first-second driving part 512 may be disposed in the second corner region of the first plate part 611. For example, if the lower surface of the first plate part 611 is divided into four planes, the first-second driving part 512 may be disposed in a first quadrant. In this case, the first-second driving part 512 may be arranged such that the N pole and the S pole are arranged in a vertical direction. For example, the first-second driving part 512 may be disposed on the lower surface of the first plate part 611 such that the N pole and the S pole are positioned in the Y-axis direction. In this case, the first-first driving part 511 and the first-second driving part 512 may be disposed such that the N pole and the S pole are perpendicular to each other. For example, the first-second driving part 512 may be disposed while being rotated 90 degrees to the right with respect to the first-first driving part 511.

The first-third driving part 513 may be disposed in one region of the first plate part 611 of the spring plate 610. Preferably, the first-third driving parts 513 may be disposed in the third corner region of the first plate part 611. For example, when the lower surface of the first plate part 611 is divided into four planes, the first-third driving parts 513 may be disposed in a fourth quadrant. In this case, the first-third driving part 513 may be arranged such that the N pole and the S pole are arranged in a horizontal direction. For example, the first-third driving part 513 may be disposed on the lower surface of the first plate part 611 such that the N pole and the S pole are positioned in the X-axis direction. In this case, the first-second driving part 512 and the first-third driving part 513 may be disposed such that the N pole and the S pole are perpendicular to each other. Also, the first-first driving part 511 and the first-third driving part 513 may be disposed such that the N pole and the S pole are in opposite directions. For example, the first-third driving part 513 may be disposed in a state rotated 90 degrees in a right direction with respect to the first-second driving part 512. The first-third driving part 513 may be disposed in a state rotated 180 degrees in the right direction with respect to the first-first driving part 511.

The first-fourth driving part 514 may be disposed in one region of the first plate part 611 of the spring plate 610. Preferably, the first-fourth driving part 514 may be disposed in the fourth corner region of the first plate part 611. For example, when the lower surface of the first plate part 611 is divided into four planes, the first-fourth driving part 514 may be disposed in the third quadrant. In this case, the first-fourth driving pars 514 may be arranged such that the N pole and the S pole are arranged in a vertical direction. For example, the first-fourth driving part 514 may be disposed on the lower surface of the first plate part 611 such that the N pole and the S pole are positioned in the Y-axis direction. In this case, the first-third driving part driving part 513 and the first-fourth driving part 514 may be disposed such that the N pole and the S pole are perpendicular to each other. Also, the first-second driving part 512 and the first-fourth driving part 514 may be disposed such that the N pole and the S pole are in opposite directions to each other. For example, the first-fourth driving part 514 may be disposed in a state rotated 90 degrees to the right direction with respect to the first-second driving part 513. The first-fourth driving part 514 may be disposed in a state rotated 180 degrees in the right direction with respect to the first-second driving part 512. The first-fourth driving part 514 may be disposed in a state rotated by 90 degrees to the left direction or 270 degrees to the right direction with respect to the first-first driving part 511.

Here, the first-first driving part 511 and the first-third driving part 513 in which the N pole and S pole arranged in the X-axis direction are a first driving part of a first group for moving the image sensor substrate 600 in the X-axis direction. In addition, the first-second driving part 512 and the first-fourth driving part 514 in which the N pole and the S pole are arranged in the Y-axis direction are a first driving part of a second group for moving the image sensor substrate 600 in the Y-axis direction. Also, any one or both of the first driving part of the first group and the first driving part of the second group may tilt the image sensor substrate 600. This will be described in more detail below.

As described above, in the embodiment, the first driving part 510 may be disposed such that the same poles are adjacent to each other with respect to the center C so as to receive a force from the third driving part 530. In addition, the driving parts adjacent to each other among the first driving parts 510 make the arrangement directions of the N pole and the S pole perpendicular to each other.

Accordingly, the first driving part 510 may be arranged such that the same pole is adjacent to the center C, and the same pole surrounds an outer part. That is, an outer part of the first plate part 611 may include a left part, a right part, an upper part, and a lower part. In addition, the left part may be disposed to face the N pole of the first-first driving part 511. In addition, the upper part may be disposed to face the N pole of the first-second driving part 512. In addition, the right part may be disposed to face the N pole of the first-third driving part 513. Also, the lower part may be disposed to face the N pole of the first-fourth driving part 514.

FIG. 9 is a view showing an arrangement structure of a second driving part according to an embodiment.

Referring to FIG. 9, the second driving part 520 may include a second-first driving part 521, a second-second driving part 522, a second-third driving part 523, and a second-fourth driving part 524.

The second-first driving part 521 may be disposed to overlap with the first-first driving part 511 constituting the first driving part 510 in the vertical direction. In addition, the second-first driving part 521 may be disposed to correspond to the arrangement direction of the N pole and the S pole of the first-first driving part 511. A driving direction (or movement direction) of the first-first driving part 511 is determined according to a direction of a current applied to the second-first driving part 521. For example, when the direction of the current applied to the second-first driving part 521 is a first direction, the first-first driving part 511 may move in the −X-axis direction. Also, when the direction of the current applied to the second-first driving part 521 is a second direction opposite to the first direction, the first-first driving part 511 may move in the +X-axis direction.

The second-second driving part 522 may be disposed to overlap with the first-second driving part 512 constituting the first driving part 510 in the vertical direction. In addition, the second-second driving part 522 may be disposed to correspond to the arrangement direction of the N pole and the S pole of the first-second driving part 512. A driving direction (or movement direction) of the first-second driving part 512 is determined according to a direction of a current applied to the second-second driving part 522. For example, when the direction of the current applied to the second-second driving part 522 is a first direction, the first-second driving part 512 may move in the −Y-axis direction. Also, when the direction of the current applied to the second-second driving part 522 is a second direction opposite to the first direction, the first-second driving part 512 may move in the +Y-axis direction.

The second-third driving part 523 may be disposed to overlap with the first-third driving part 513 constituting the first driving part 510 in the vertical direction. In addition, the second-third driving part 523 may be disposed to correspond to the arrangement direction of the N pole and the S pole of the first-third driving part 513. A driving direction (or movement direction) of the first-third driving part 513 is determined according to a direction of a current applied to the second-third driving part 523. For example, when the direction of the current applied to the second-third driving part 523 is a first direction, the first-third driving part 513 may move in the +X-axis direction. Also, when the direction of the current applied to the second-third driving part 523 is a second direction opposite to the first direction, the first-third driving part 513 may move in the −X-axis direction.

The second-fourth driving part 524 may be disposed to overlap with the first-fourth driving part 514 constituting the first driving part 510 in the vertical direction. In addition, the second-fourth driving part 524 may be disposed to correspond to the arrangement direction of the N pole and the S pole of the first-fourth driving part 514. A driving direction (or movement direction) of the first-fourth driving part 514 is determined according to a direction of a current applied to the second-fourth driving part 524. For example, when the direction of the current applied to the second-fourth driving part 524 is a first direction, the first-fourth driving part 514 may move in the +Y-axis direction. Also, when the direction of the current applied to the second-fourth driving part 524 is a second direction opposite to the first direction, the first-fourth driving part 514 may move in the −Y-axis direction.

Here, the second-first driving part 521 and the second-third driving part 523 are a second driving part of a first group for moving the image sensor substrate 600 in the +X-axis direction or the −X-axis direction. In addition, the second-second driving part 522 and the second-fourth driving part 524 are a second driving part of a second group for moving the image sensor substrate 600 in the +Y axis or the −Y axis direction. In addition, any one or both of the second driving part of the first group and the second driving part of the second group may tilt the image sensor substrate 600.

Hereinafter, operations of the first driving part 510 and the second driving part 520 for moving the image sensor substrate 600 in the +X-axis direction, the −X-axis direction, the +Y-axis direction, and the −Y-axis direction to be explained.

(1) Movement in the +X-Axis Direction

In order to move the image sensor substrate 600 in the +X-axis direction, a current may be applied to the second-first driving part 521 and the second-third driving part 523. To this end, a current in the first direction may be applied to the second-first driving part 521, and a current in the second direction may be applied to the second-third driving part 523. Accordingly, a force from the N pole to the S pole is applied to the first-first driving part 511 of the first driving part 510, and a force from the S pole to the N pole direction is applied to the first-third driving part 513. In addition, the image sensor substrate 600 may move in the +X-axis direction according to the driving directions of the first-first driving part 511 and the first-third driving part 513.

(2) Movement in the −X-Axis Direction

In order to move the image sensor substrate 600 in the −X-axis direction, a current may be applied to the second-first driving part 521 and the second-third driving part 523. To this end, a current in the second direction may be applied to the second-first driving part 521, and a current in the first direction may be applied to the second-third driving part 523. Accordingly, a force from the S pole to the N pole is applied to the first-first driving part 511 of the first driving part 510, and a force from the N pole to the S pole is applied to the first-third driving part 513. In addition, the image sensor substrate 600 may move in the −X-axis direction according to the driving directions of the first-first driving part 511 and the first-third driving part 513.

(3) Movement in the +Y-Axis Direction

In order to move the image sensor substrate 600 in the +Y-axis direction, a current may be applied to the second-second driving part 522 and the second-fourth driving part 524. To this end, a current in the first direction may be applied to the second-second driving part 522 and a current in the second direction may be applied to the second-fourth driving part 524. Accordingly, a force from the N pole to the S pole is applied to the first-second driving part 512 of the first driving part 510, and a force from the S pole to the N pole direction is applied to the first-fourth driving part 514. Also, the image sensor substrate 600 may move in the +Y-axis direction according to the driving directions of the first-second driving part 512 and the first-fourth driving part 513.

(4) Movement in the −Y Axis Direction

In order to move the image sensor substrate 600 in the −Y-axis direction, a current may be applied to the second-second driving part 522 and the second-fourth driving part 524. To this end, a current in the second direction may be applied to the second-second driving part 522 and a current in the first direction may be applied to the second-fourth driving part 524. Accordingly, ae force from the S pole to the N pole is applied to the first-second driving part 512 of the first driving part 510, and a force from the N pole to the S pole direction is applied to the first-fourth driving part 514. In addition, the image sensor substrate 600 may move in the −Y-axis direction according to the driving directions of the first-second driving part 512 and the first-fourth driving part 513.

(5) Tilt Clockwise

The tilt of the image sensor substrate 600 may include a clockwise tilt and a counterclockwise tilt. The clockwise tilt includes a first method of applying a current to the second-first driving part 521 and the second-third driving part 523, a second method of applying a current to all of the second-second driving part 522 and the second-fourth driving part 524, and a third method of applying a current to the second-first driving part 521, the second-second driving part 522, the second-third driving part 523, and the second-fourth driving part 524.

When the first method is described, current may be applied to the second-first driving part 521 and the second-third driving part 523 in the same first direction. At this time, the N-pole and S-pole directions of the first-first driving part 511 and the first-third driving part 513 are opposite to each other. Accordingly, as the current is applied in the first direction as described above, the first-first driving part 511 may move in the +X axis, and the first-third driving part 513 may move in the −X axis, and thus Accordingly, the image sensor substrate 600 may be tilted clockwise.

When the second method is described, current may be applied to the second-second driving part 522 and the second-fourth driving part 524 in the same first direction. In this case, the N-pole and S-pole directions of the first-second driving part 512 and the first-fourth driving part 514 are opposite to each other. Accordingly, as the current is applied in the first direction as described above, the first-second driving part 512 may move in the +Y axis, and the first-fourth driving part 514 may move in the −Y axis, and thus Accordingly, the image sensor substrate 600 may be tilted clockwise.

When the third method is described, the current may be applied to the second-first driving part 521 and the second-third driving part 523 in the same first direction. Also, the current may be applied to the second-second driving part 522 and the second-fourth driving part 524 in the same first direction. Accordingly, the first-first driving part 511 may move in the +X axis, the first-third driving part 513 may move in the −X axis, and the first-second driving part 512 may move in the +Y axis. and the first-fourth driving part 514 may move along the −Y axis, and accordingly, the image sensor substrate 600 may be tilted clockwise.

(6) Tilt Counterclockwise

The tilt of the image sensor substrate 600 may include a clockwise tilt and a counterclockwise tilt. The clockwise tilt includes a first method of applying a current to the second-first driving part 521 and the second-third driving part 523, a second method of applying a current to the second-second driving part 522 and the second-fourth driving part 524, and a third method of applying a current to all of the second-first driving part 521, the second-second driving part 522, the second-third driving part 523, and the second-fourth driving part 524.

When the first method is described, the current may be applied to the second-first driving part 521 and the second-third driving part 523 in the same second direction. At this time, the N-pole and S-pole directions of the first-first driving part 511 and the first-third driving part 513 are opposite to each other. Accordingly, as the current is applied in the second direction as described above, the first-first driving part 511 may move in the −X axis, and the first-third driving part 513 may move in the +X axis, and thus Accordingly, the image sensor substrate 600 may be tilted counterclockwise.

In the second method, current may be applied to the second-second driving part 522 and the second-fourth driving part 524 in the same second direction. In this case, the N-pole and S-pole directions of the first-second driving part 512 and the first-fourth driving part 514 are opposite to each other. Accordingly, as the current is applied in the second direction as described above, the first-second driving part 512 may move in the −Y axis, and the first-fourth driving part 514 may move in the +Y axis, and thus Accordingly, the image sensor substrate 600 may be tilted counterclockwise.

When the third method is described, current may be applied to the second-first driving part 521 and the second-third driving part 523 in the same second direction. Also, a current may be applied to the second-second driving part 522 and the second-fourth driving part 524 in the same second direction. Accordingly, the first-first driving part 511 may move in the −X axis, the first-third driving part 513 may move in the +X axis, and the first-second driving part 512 may move in the −Y axis. and the first-fourth driving part 514 may move in the +Y axis, and accordingly, the image sensor substrate 600 may be tilted counterclockwise.

FIG. 10 is a view showing an arrangement structure of a third driving part according to an embodiment.

Referring to FIG. 10, the third driving part 530 may be configured as a coil. The third driving part 530 may be disposed on the support layer 660 while surrounding the first driving part 510. In this case, the third driving part 530 may be disposed to face the N poles of each of the first-first to first-fourth driving parts constituting the first driving part 510. Accordingly, when a current in the first direction is applied to the third driving part 530, a force in the +Z axis direction may be applied to the first driving part 510 to move in the +Z axis direction. In addition, when a current in the second direction is applied to the third driving part 530, a force in the −Z axis direction may be applied to the first driving part 510 to move in the −Z axis direction.

FIG. 11 is a view showing an arrangement structure of a third driving part according to another exemplary embodiment.

Referring to FIG. 11, the third driving part may be formed of an electromagnet. To this end, the third driving part 530 includes a magnetic body 531 and a coil part 532 surrounding the magnetic body 531. At this time, when a current is applied to the coil part 532 in the first direction, magnetic force of N pole and S pole is generated in the magnetic body 531 based on an upper part and a lower part. In this case, the third driving part 530 is disposed under the first driving part 510 together with the second driving part 520. In this case, the third driving part 530 is disposed to overlap at least a part of the first driving part 510 based on a center of the first driving part 510.

In other words, the third driving part 530 may be include a region overlapping a part of the S pole of the first-first driving part 511, a region overlapping a part of the S pole of the first-second driving part 512, a region overlapping a part of the S pole of the first-third driving part 513, and a region overlapping a part of the S pole of the first-fourth driving part 514. And, when a current in the first direction is applied to the third driving part 530, an upper part of the third driving part 530 becomes the N pole and a lower part of the third driving part 530 becomes the S pole. Accordingly, an attractive force is generated between the first driving part 510 and the third driving part 530, and the first driving part 510 may be moved in the −Z axis direction. Conversely, when a current in the second direction is applied to the third driving part 530, the upper part of the third driving part 530 becomes the S pole and the lower part of the third driving part 530 becomes the N pole. Accordingly, a repulsive force is generated between the first driving part 510 and the third driving part 530, and the first driving part 510 may move in the +Z-axis direction.

FIG. 12 is a view showing an arrangement structure of a third driving part according to another exemplary embodiment.

In FIG. 11, the third driving part 530 is configured using only one electromagnet. In this case, a strength of the magnetic field transmitted to the first driving part 510 by one third driving part 530 may be weak. Accordingly, the third driving part 530 according to another embodiment may include a plurality of electromagnets.

To this end, the third driving part 530 includes a third-first driving part 530A, a third-second driving part 530B, a third-third driving part 530C, and a third-fourth driving part 530D.

The third-first driving part 530A may include a region overlapping a part of the S pole of the first-first driving part 511 and a region overlapping a part of the S pole of the first-second driving part 512. Preferably, the third-first driving part 530A may be disposed to overlap a region between the first-first driving part 511 and the first-second driving part 512 in the vertical direction.

The third-second driving part 530B may include a region overlapping a part of the S pole of the first-second driving part 512 and a region overlapping a part of the S pole of the first-third driving part 513. Preferably, the third-second driving part 530B may be disposed to overlap a region between the first-second driving part 512 and the first-third driving part 513 in the vertical direction.

The third-third driving part 530C may include a region overlapping a part of the S pole of the first-third driving part 513 and a region overlapping a part of the S pole of the first-fourth driving part 514. Preferably, the third-third driving part 530C may be disposed to overlap a region between the first-third driving part 513 and the first-fourth driving part 514 in the vertical direction.

The third-fourth driving part 530D may include a region overlapping a part of the S pole of the first-first driving part 511 and a region overlapping a part of the S pole of the first-fourth driving part 514. Preferably, the third-fourth driving part 530D may be disposed to overlap a region between the first-first driving part 511 and the first-fourth driving part 514 in the vertical direction.

According to an embodiment, in order to implement the OIS and AF functions of the camera module, instead of moving the conventional lens barrel, the image sensor is moved with respect to the lens barrel in the X-axis, Y-axis and Z-axis directions. Accordingly, the camera module according to the embodiment may remove a complex spring structure for implementing the OIS and AF functions, and thus the structure may be simplified. In addition, by moving the image sensor according to the embodiment with respect to the lens barrel, it is possible to provide a stable structure compared to the conventional structure.

In addition, according to an embodiment, the extension pattern part electrically connected to the image sensor has a spring structure and is disposed to float on a spring plate. Accordingly, the camera module may move the image sensor while elastically supporting the image sensor more stably. In addition, the length of the extension pattern part is at least 1.5 to 4 times the linear distance between the first lead pattern part and the second lead pattern part. Accordingly, it is possible to minimize noise generation while improving the mobility of the image sensor substrate.

In addition, according to an embodiment, by preventing the elastic member and the extension pattern part from being aligned with each other in the vertical direction, it is possible to solve an electrical reliability problem that may occur due to a contact between the elastic member and the extension pattern part.

In addition, in the insulating layer in the embodiment, an extension insulating part having a spring shape is disposed in a region that vertically overlaps with the extension pattern part, so that the spring plate can be removed. Accordingly, the camera module may move the image sensor with respect to the lens barrel while elastically supporting the image sensor more stably, and may minimize the product volume.

In addition, in the embodiment, the width of the extension insulating part is greater than the width of the extension pattern part, so that the extension pattern part can be stably supported by the extension insulating part, and thus operation reliability can be improved.

In addition, in the embodiment, the first driving part composed of a permanent magnet is disposed so that the same poles are adjacent to each other with respect to the center, while the N poles and the S poles of the permanent magnets adjacent to each other are perpendicular to each other. According to this, in the embodiment, it is possible to secure the arrangement freedom of the second driving part and the third driving part for adjusting the electromagnetic force in response to the permanent magnet, it is possible to move in the X-axis and Y-axis, and stable tilt control is also possible.

FIG. 13 is a view showing a connection structure between a flexible circuit board and a board for an image sensor according to an embodiment.

Referring to FIG. 13, the flexible circuit board 800 electrically connects the image sensor substrate 600 and an external main substrate (not shown) to each other.

One end of the flexible circuit board 800 may be connected to the image sensor substrate 600. The flexible circuit board 800 may receive an electrical signal output from the image sensor 700. The flexible circuit board 800 may have a connector 810 at the other end. A main board (not shown) may be connected to the connector 810.

That is, the flexible circuit board 800 may connect the camera module and the main board of the external device. Specifically, the flexible circuit board 800 may connect between the conductive pattern portion 650 of the image sensor substrate 600 of the camera module and the main board of a portable terminal.

To this end, an region of the flexible circuit board 800 is disposed inside the housing 300, and accordingly, may be connected to the conductive pattern portion 650 of the image sensor substrate 600.

That is, the flexible circuit board 800 may include a first connector part 801, a second connector part 803, and a connection part 802.

The first connector part 801 may be disposed inside the housing 300. The first connector part 801 may include a plurality of pads 804, 805, 806, and 807 connected to the conductive pattern portion 650.

The first connector part 801 may be electrically connected to the second lead pattern part 656 of the conductive pattern portion 650. That is, the plurality of pads 804, 805, 806, and 807 of the first connector part 801 may be electrically connected to the second lead pattern part 656.

To this end, the first connector part 801 may include a first pad part 804 connected to the second lead pattern part 656 of the first conductive pattern part 651. In addition, the first connector part 801 may include a second pad part 805 connected to the second lead pattern part 656 of the second conductive pattern part 652. In addition, the first connector part 801 may include a third pad part 806 connected to the second lead pattern part 656 of the third conductive pattern part 653. In addition, the first connector part 801 may include a fourth pad part 807 connected to the second lead pattern part 656 of the fourth conductive pattern part 654.

In this case, the first connector part 801 has a shape corresponding to the second insulating part 632 of the insulating layer 630. Accordingly, the first connector part 801 may be disposed surrounding an upper region of the second lead pattern part 656 of the conductive pattern portion 650, and the plurality of pads 804, 805, 806, and 807 may be disposed on a lower surface of the first connector part 801.

The connection part 802 connects the first connector part 801 and the second connector part 803 to each other. A part of the connection part 802 may be disposed in the housing 300, and may be extended therefrom to be exposed to the outside of the housing 300.

The second connector part 803 may include a connector 810 connected to the main board of the terminal.

Meanwhile, the image sensor 1700 may be attached on the first insulating part 1631 of the insulating layer 1610.

In this case, an electrode 710 of the image sensor 700 faces upward and may be attached to the first insulating part 631. In addition, a connection member 720 such as a metal wire is formed between the electrode 710 of the image sensor 700 and the first lead pattern part 655. The connection member 720 may electrically connect the electrode of the image sensor and the first lead pattern part.

FIG. 14 is a view for explaining in detail a layer structure of a conductive pattern portion according to an embodiment.

Referring to FIG. 14, the conductive pattern portion 650 is disposed on the second bonding sheet 640 disposed on the insulating layer 630. In this case, the conductive pattern portion 650 includes the first lead pattern part 655 disposed on the first insulating part 631 of the insulating layer 630, the second lead pattern part 656 on the second insulating part 632, and the extension pattern part 657 connecting therebetween.

In this case, each of the first lead pattern part 655, the second lead pattern part 656, and the extension pattern part 657 may include a metal layer 650A and a plating layer 650B.

The metal layer 650A may be disposed on the second bonding sheet 640. That is, the metal layer 650A is disposed on the second bonding sheet 640 to configure the first lead pattern part 655, the second lead pattern part 656, and the extension pattern part 657, respectively.

The plating layer 650B may be disposed on the metal layer 650A. Preferably, the plating layer 650B may be a surface treatment layer disposed on the metal layer 650A.

The plating layer 650B includes any one of Ni/Au alloy, gold (Au), electroless nickel immersion gold (ENIG), Ni/Pd alloy, and organic compound plating (Organic Solderability Preservative, OSP).

In this case, the plating layers 650B constituting the first lead pattern part 655 and the second lead pattern part 656 may correspond to each other. Alternatively, the plating layer 650B constituting the extension pattern part 657 may have a thickness different from that of the plated layer 650B constituting the first lead pattern part 655 and the second lead pattern part 656.

That is, the plating layer 650B of the first lead pattern part 655 and the second lead pattern part 656 may be selectively formed only on upper and side surfaces of the corresponding metal layer 650A. In contrast, the metal layer 650A constituting the extension pattern part 657 is disposed in a floating state on the above-described open region. Accordingly, the plating layer 650B of the extension pattern part 657 may be formed to surround the entire surface of the corresponding metal layer 650A. That is, the plating layer 650B of the extension pattern part 657 may be formed to surround the upper, side, and lower surfaces of the metal layer 650A of the extension pattern part 657.

Accordingly, the lower surface of the first lead pattern part 655 and the upper surface of the spring plate 610 may be spaced apart by a first distance. In addition, the lower surface of the second lead pattern part 656 and the upper surface of the spring plate 610 may be spaced apart by the first distance. In addition, the lower surface of the extension pattern part 657 and the spring plate 610 may be spaced apart by a second distance smaller than the first distance due to the plating layer.

Meanwhile, the thickness of the plating layer 650B may be 0.3 μm to 1 μm. For example, the thickness of the plating layer 650B may be 0.3 μm to 0.7 μm. The thickness of the plating layer 650B may be 0.3 μm to 0.5 μm.

FIG. 15 is a view showing a camera module according to another exemplary embodiment.

Referring to FIG. 15, the image sensor may be attached to the image sensor substrate 600 in a flip chip bonding method.

That is, after the image sensor in the previous embodiment is attached on the insulating layer 630, the first lead pattern part 655 and the electrode 710 of the image sensor 700 are mutually connected by wire bonding through a connection member.

Alternatively, the image sensor may be mounted on the package substrate, and accordingly, the image sensor may be mounted on the image sensor substrate 600 on the insulating layer 630 in a flip chip bonding method.

The package substrate 900 may include an insulating layer 910, a circuit pattern 920, a via 930, an image sensor 940, a connection member 950, a protection member 960, and an adhesive member 970.

The image sensor 940 may be electrically connected to the circuit patterns 920 respectively disposed on the upper and lower surfaces of the insulating layer 910 through the connection member 950. Further, the via 930 may electrically connect the circuit patterns 920 disposed on the upper and lower surfaces of the insulating layer 910 to each other.

The protection member 960 may be disposed on the lower surface of the insulating layer 910 to protect the lower surface of the insulating layer 910 and expose at least a part of the circuit pattern 920. In addition, an adhesive member 970 may be disposed on the circuit pattern exposed through the protection member 960. The adhesive member 970 may be a solder ball. The adhesive member 970 may contain materials of heterogeneous components in solder. The solder may be composed of at least one of SnCu, SnPb, and SnAgCu. In addition, the material of the heterogeneous component may include any one of Al, Sb, Bi, Cu, Ni, In, Pb, Ag, Sn, Zn, Ga, Cd, and Fe.

Meanwhile, in a state in which the package substrate 900 as described above is manufactured, the adhesive member 970 may be connected to the first lead pattern part 655.

FIG. 16 is a view showing a camera device according to another exemplary embodiment.

Referring to FIG. 16, the camera device according to the embodiment may include a lens barrel 1100, a lens assembly 1200, a housing 1300, an infrared cut filter 1400, driving parts 1510, 1520, 1530, and an image sensor substrate 1600, an image sensor 1700, and a flexible circuit board 1800.

Here, since the lens barrel 1100, the lens assembly 1200, the housing 1300, and the infrared cut filter 1400 have already been described in FIG. 2, a detailed description thereof will be omitted.

At this time, in FIG. 2, the image sensor substrate 600 is moved with respect to the lens barrel by the spring plate 610. Alternatively, in the camera device of FIG. 16, the spring plate 610 is removed, and an elastic region is formed on the insulating layer 1610 to enable movement of the image sensor substrate 1600.

The image sensor substrate 1600 is a substrate on which the image sensor 1700 is mounted. Specifically, the image sensor substrate 1600 may be driven by the driving parts 1510, 1520, and 1530 to move the image sensor 1700 in the X-axis, Y-axis, and Z-axis directions. Also, the image sensor substrate 1600 may be driven by the driving parts 1510, 1520, and 1530 to tilt the image sensor 1700.

The image sensor substrate 1600 may be disposed to be spaced apart from a bottom surface of the housing 1300 by a predetermined distance. In addition, the image sensor substrate 1600 may relatively move the mounted image sensor 1700 with respect to the housing 1300.

To this end, the image sensor substrate 1600 may include an insulating layer 1610, a first bonding sheet 1620, a conductive pattern portion 1640, and a support layer 1650. Also, according to an embodiment, the image sensor substrate 1600 may further include a second bonding sheet 1630. That is, the second bonding sheet 1630 may be selectively disposed between the insulating layer 1610 and the conductive pattern portion 1640. When the second bonding sheet is included, a planar area of the second bonding sheet in one embodiment may be same as a planar area of the insulating layer 1610, and a planar area of the second bonding sheet in another embodiment may be same as a planar area of the conductive pattern portion 1640.

The insulating layer 1610 may move the image sensor 1700 disposed on the image sensor substrate 1600 in the X-axis, Y-axis, and Z-axis directions while supporting the conductive pattern portion 1640. To this end, the insulating layer 1610 may include an elastic region having a certain elastic force. Preferably, the insulating layer 1610 may include a plurality of elastic regions. For example, the insulating layer 1610 may include four elastic regions.

That is, at least one region of the insulating layer 1610 may have a certain elastic force, accordingly, while the image sensor substrate 1600 is elastically supported, the image sensor substrate 1600 may be moved in the X-axis, Y-axis, and Z-axis directions.

At this time, the insulating layer 1610 is a substrate for forming the conductive pattern portion 1640, this may include all of a print, a wiring board, and an insulating substrate made of an insulating material capable of forming the conductive pattern part 1640 on the surface of the insulating layer.

A conductive pattern portion 1640 is disposed on the insulating layer 1610. The conductive pattern portion 1640 may include lead pattern parts spaced apart from each other by a predetermined distance on the insulating layer 1610. For example, the conductive pattern portion 1640 may include a first lead pattern part connected to the image sensor 1700 and a second lead pattern part connected to the flexible circuit board 1800. Also, the conductive pattern portion 1650 may include an extension pattern part connecting between the first lead pattern part and the second lead pattern part. The first lead pattern part, the second lead pattern part, and the extension pattern part will be described in detail below.

Also, the insulating layer 1610 may include a first insulating part on which the first lead pattern part is disposed, a second insulating part on which the second lead pattern part is disposed, and an extension insulating part on which the extension pattern part is disposed. The first insulating part, the second insulating part, and the extension insulating part will be described in more detail below.

Meanwhile, a bonding sheet 1630 may be disposed between the insulating layer 1610 and the conductive pattern portion 1640. The bonding sheet 1630 may provide an adhesive force between the insulating layer 1610 and the conductive pattern portion 1640. In this case, the bonding sheet 1630 may have a shape corresponding to the insulating layer 1610. To this end, the bonding sheet 1630 may include an elastic region having an elastic force corresponding to the insulating layer 1610. For example, the bonding sheet 1630 may include a first bonding part, a second bonding part, and an extension bonding part between the first bonding part and the second bonding part.

In the embodiment, the image sensor substrate may move the image sensor by providing an elastic force from the extension insulating part of the insulating layer 1610, the extension bonding part of the bonding sheet 1630, and the extension pattern part of the conductive pattern portion 1640. Preferably, the extension insulating part, the extension bonding part, and the extension pattern part may be referred to as an elastic member. In addition, the elastic member may have a layered structure including an insulating layer region, a bonding layer region, and a pattern layer region. This will be described in more detail below. In addition, the second bonding sheet 1630 may be omitted in the image sensor substrate according to the embodiment. For example, the conductive pattern portion 1640 may be directly disposed on the insulating layer 1610 without the second bonding sheet 1630. That is, an upper surface of the extension insulating part and a lower surface of the extension pattern part may directly contact each other without the extension bonding part of the insulating layer 1610. Accordingly, in an embodiment, only the extension insulating part and the extension pattern part may serve as an elastic member without the extension bonding part.

FIG. 17 is a view showing the insulating layer shown in FIG. 16.

Referring to FIG. 17, the insulating layer 1610 may elastically support the second bonding sheet 1630 and the conductive pattern portion 1640 constituting the image sensor substrate 1600.

The insulating layer 1610 may have an elastic region having a certain elastic force to move the image sensor 1700 disposed on the image sensor substrate 1600 in the X-axis, Y-axis, and Z-axis directions.

To this end, the elastic region may include an extension insulating part 1614 having elasticity of the insulating layer 1610. Specifically, the insulating layer 1610 may have a first insulating part 1611 disposed at the center of the insulating layer 1610. In addition, a second insulating part 1612 may be disposed to surround the first insulating part 611 at a position spaced apart from the first insulating part 1611 by a predetermined interval.

In addition, the insulating layer 1610 may include a first insulating part 1611 and a second insulating part 1612, and an open region 1613 may form between the first insulating part 1611 and the second insulating part 1612. Preferably, the first insulating part 1611 and the second insulating part 1612 may be spaced apart from each other with the open region 1613 therebetween.

In addition, one end of the extension insulating part 1614 may be connected to the first insulating part 1611, and the other end may be connected to the second insulating part 1612. To this end, a plurality of extension insulating parts 1614 may be provided. Preferably, the extension insulating part 1614 may include first to fourth extension insulating parts 1614.

The first insulating part 1611 may include a plurality of outer parts. Preferably, the first insulating part 1611 may include a left outer part, a right outer part, an upper outer part, and a lower outer part.

The second insulating part 1612 may include a plurality of inner parts. Preferably, the second insulating part 1612 may include a left inner part, a right inner part, an upper inner part, and a lower inner part.

In this case, the left outer part of the first insulating part 1611 and the left inner part of the second insulating part 1612 may be disposed to face each other. In addition, the first extension insulating part constituting the extension insulating part 1614 may connect the left outer part of the first insulating part 1611 and the left inner part of the second insulating part 1612 to each other.

Also, the right outer part of the first insulating part 1611 and the right inner part of the second insulating part 1612 may be disposed to face each other. In addition, the second extension insulating part constituting the extension insulating part 1614 may connect the right outer part of the first insulating part 1611 and the right inner part of the second insulating part 1612 to each other.

In addition, the upper outer part of the first insulating part 1611 and the upper inner part of the second insulating part 1612 may be disposed to face each other. In addition, the third extension insulating part constituting the extension insulating part 1614 may connect the upper outer part of the first insulating part 1611 and the upper inner part of the second insulating part 1612 to each other.

In addition, the lower outer part of the first insulating part 1611 and the lower inner part of the second insulating part 1612 may be disposed to face each other. In addition, the fourth extension insulating part constituting the extension insulating part 1614 may connect the lower outer part of the first insulating part 1611 and the lower inner part of the second insulating part 1612 to each other.

Also, the first insulating part 1611, the second insulating part 1612, and the extension insulating part 1614 may be integrally formed. Through this, it is possible to further utilize the elastic force of the insulating layer 1610 when the image sensor is tilted, and it is possible to prevent separation between the first insulating part 1611, the extension insulating part 1614, and the second insulating part 1612.

That is, the insulating layer 1610 may be etched or physically punched to have a spring shape of the extension insulating part 1614 on one insulating member to form the open region 1613. Accordingly, the first insulating part 1611, the second insulating part 1612, and the extension insulating part 1614 may be formed of the same insulating material. However, the embodiment is not limited thereto.

In other words, each of the first insulating part 1611, the second insulating part 1612, and the extension insulating part 1614 may be formed in separate configurations. That is, the insulating layer 1610 according to the embodiment may be formed by further forming a configuration corresponding to the extension insulating part 1614 between the first insulating part 1611 and the second insulating part 1612, after preparing the first insulating part 1611 and the second insulating part 1614.

On the other hand, the length of the extension insulating part 1614 is set to have at least 1.5 times the linear distance between the first insulating part 1611 and the second insulating part 1612. In addition, the length of the extension insulating part 1614 is set to be 20 times or less than the linear distance between the first insulating part 1611 and the second insulating part 1614. Preferably, the length of the extension insulating part 1614 is set to be less than 4 times the linear distance between the first insulating part 1611 and the second insulating part 1612.

Here, the linear distance may mean a distance between an outer surface and an inner surface facing each other in the first insulating part 1611 and the second insulating part 1612. Preferably, the linear distance may be a distance between the left outer surface of the first insulating part 1611 and the left inner surface of the second insulating part 1612. In addition, the linear distance may be a distance between the right outer surface of the first insulating part 1611 and the right inner surface of the second insulating part 1612. Also, the linear distance may be a distance between an upper outer surface of the first insulating part 1611 and an upper inner surface of the second insulating part 1612. Also, the linear distance may be a distance between a lower outer surface of the first insulating part 1611 and a lower inner surface of the second insulating part 1612.

Meanwhile, a linear distance between the first insulating part 1611 and the second insulating part 1612 may be 1.5 mm. At this time, if less than 1.5 times the linear distance between the first insulating part 1614 and the second insulating part 1612 of the extension insulating part 1614, the mobility of the image sensor substrate 1600 may be reduced due to the decrease in elastic force of the extension insulating part 1614. In addition, if the length of the extension insulating part 1614 is greater than 20 times the linear distance between the first insulating part 1614 and the second insulating part 1612, an image sensor 1700 disposed on the insulating layer 1610 cannot be stably supported, and thus a problem may occur in movement accuracy. Accordingly, in the embodiment, in order to improve mobility, the length of the extension insulating part 1614 is set to be less than 4 times the linear distance between the first insulating part 1611 and the second insulating part 1612.

Accordingly, the extension insulating part 1614 may be formed to have a plurality of bent spring shapes in the open region 1613.

FIG. 18 is a view illustrating the second bonding sheet shown in FIG. 16.

Referring to FIG. 18, the second bonding sheet 1630 is disposed on the insulating layer 1610. In this case, the second bonding sheet 1630 has a planar shape corresponding to the planar shape of the insulating layer 1610.

That is, the second bonding sheet 1630 may include a first bonding part 1631 disposed on the first insulating part 1611 of the insulating layer and a second bonding part 1632 disposed on the second insulating part 1612 of the insulating layer 1610. In addition, the second bonding sheet 1630 may include an open region 1633 between the first bonding part 1631 and the second bonding part 1632.

The second bonding part 1632 is disposed to surround the first bonding part 1631 at a position spaced apart from the first bonding part 1631 by a predetermined distance. In this case, the second bonding part 1632 does not directly contact the first bonding part 1631. Accordingly, the first bonding part 1631 and the second bonding part 1632 may be separated from each other through the open region 1633.

In addition, the extension bonding part 1634 connecting between the first bonding part 1631 and the second bonding part 1632 is disposed in the open region 1633. The extension bonding part 1634 has a shape corresponding to the extension insulating part 1614. The extension bonding part 1634 may be disposed in a region vertically overlapping the extension insulating part 1614. In this case, the extension bonding part 1634 may have a plane area corresponding to the extension insulating part 1614. Preferably, the plane area of the extension bonding part 1634 may be 0.9 to 1.1 times the plane area of the extension insulating part 1614. The extension bonding part 1634 of the second bonding sheet 1630 may be formed through the same process as the extension insulating part 1614 of the insulating layer 1610. Accordingly, the extension bonding part 1634 may have the same shape as the extension insulating part 1614 and have the same plane area.

The second bonding sheet 1630 may be formed of a double-sided adhesive film. The second bonding sheet 1630 may be formed of an epoxy or acrylic adhesive or a thermosetting adhesive film.

FIG. 19 is a view showing a conductive pattern portion according to an embodiment.

Referring to FIG. 19, the conductive pattern portion 1640 may be disposed on the insulating layer 1610 with a specific pattern. The conductive pattern portion 1640 includes a first conductive pattern part 1641 disposed on a first region of the insulating layer 1610 and a second conductive pattern part 1642 disposed on a second region of the insulating layer 1610, a third conductive pattern part 1643 disposed on a third region of the insulating layer 1610, and a fourth conductive pattern part 1644 disposed on a fourth region of the insulating layer 1610. In the drawing, a region vertically overlapping the first insulating part 1611 of the insulating layer 1610 and the first bonding part 1631 of the second bonding sheet 1630 is referred to as 'A', a region vertically overlapping the second insulating part 1612 of the insulating layer 1610 and the second bonding part 1632 of the second bonding sheet 1630 is referred to as 'B', and a region vertically overlapping the open region 1613 of the insulating layer 1610 and the open region 1633 of the second bonding sheet 1630 is referred to as 'C'.

Since the structure of the conductive pattern portion shown in FIG. 19 has already been described with reference to FIG. 6, a detailed description thereof will be omitted.

FIG. 20 is a plan view of a substrate for an image sensor according to another exemplary embodiment.

Referring to FIG. 20, a second bonding sheet 1630 is disposed on the insulating layer 1610. In addition, a conductive pattern portion 1640 is disposed on the second bonding sheet 1630. In this case, an open region is formed in each of the insulating layer 1610 and the second bonding sheet 1630, and the open regions may overlap each other in a vertical direction.

In addition, an elastic member having an elastic force may be disposed in each of the open regions. Here, the elastic member may refer to a part of the insulating layer 1610 and a part of the second bonding sheet 1630. That is, the elastic member constitutes a part of the insulating layer 1610 and/or the second bonding sheet 1630, and thus the insulating layer 1610 and/or the second bonding sheet 1630 may be formed of the same material. That is, an extension insulating part 1614 having a bent shape bent a plurality of times is disposed in the open region of the insulating layer 1610. The extension insulating part 1614 may have a spring shape. In addition, an extension bonding part 1634 having a bent shape bent a plurality of times is disposed in the open region of the second bonding sheet 1630. The extension bonding part 1634 may have a spring shape.

Also, the extension bonding part 1634 and the extension insulating part 1614 may have the same shape and the same planar area.

Meanwhile, the line width of the extension insulating part 1614 may be greater than the line width of the extension pattern part 1647. Accordingly, when the substrate for the image sensor is viewed from the top, at least a part of the extension insulating part 1614 positioned under the extension pattern part 1647 may be exposed.

At this time, the image sensor substrate 1600 not only moves in the X-axis direction and the Y-axis direction, but also moves in the Z-axis direction. At this time, there is a difference between the elastic modulus of the extension insulating part 1614 and the elastic modulus of the extension pattern part 1647. Accordingly, when the image sensor substrate 1600 moves in the Z-axis direction, the movement distance of the extension insulating part 1614 may appear differently. In addition, this causes a situation in which the extension pattern part 1647 comes into contact with a component made of another metal material, thereby causing an electrical reliability problem (eg, short circuit). Therefore, in the embodiment, as described above, the line width of the extension insulating part 1614 is greater than the line width of the extension pattern part 1647 to solve the electrical reliability problem.

FIG. 21 is a view showing an arrangement structure of a first driving part according to another embodiment.

Referring to FIG. 21, the first driving part 1510 is disposed on the lower surface of the first insulating part 1611 of the insulating layer 1610. That is, in FIG. 10, the first driving part is disposed on the lower surface of the first plate part 611 of the spring plate 610. Alternatively, referring to FIG. 21, the first driving part 1510 may be disposed on the lower surface of the first insulating part 1611 of the insulating layer 1610.

In this case, the first driving part 1510 differs from the first driving part in FIG. 10 only in the arrangement position, but has substantially the same structure and operation characteristics, and thus a detailed description thereof will be omitted.

According to an embodiment, in order to implement the OIS and AF functions of the camera module, instead of moving the conventional lens barrel, the image sensor is moved with respect to the lens barrel in the X-axis, Y-axis and Z-axis directions. Accordingly, the camera module according to the embodiment may remove a complex spring structure for implementing the OIS and AF functions, and thus the structure may be simplified. In addition, by moving the image sensor according to the embodiment with respect to the lens barrel, it is possible to provide a stable structure compared to the conventional structure.

In addition, according to an embodiment, the extension pattern part electrically connected to the image sensor has a spring structure to float on a spring plate. Accordingly, the camera module may move the image sensor while elastically supporting the image sensor more stably. In addition, the length of the extension pattern part is at least 1.5 to 4 times the linear distance between the first lead pattern part and the second lead pattern part. Accordingly, it is possible to minimize noise generation while improving the mobility of the image sensor substrate.

In addition, according to an embodiment, by preventing the elastic member and the extension pattern part from being aligned with each other in the vertical direction, it is possible to solve an electrical reliability problem that may occur due to a contact between the elastic member and the extension pattern part.

In addition, in the insulating layer in the embodiment, an extension insulating part having a spring shape is disposed in a region that vertically overlaps with the extension pattern part, so that the spring plate can be removed. Accordingly, the camera module may move the image sensor with respect to the lens barrel while elastically supporting the image sensor more stably, and may minimize the product volume.

In addition, in the embodiment, the width of the extension insulating part is greater than the width of the extension pattern part, so that the extension pattern part can be stably supported by the extension insulating part, and thus operation reliability can be improved.

In addition, in the embodiment, the first driving part composed of a permanent magnet is disposed so that the same poles are adjacent to each other with respect to the center, while the N poles and the S poles of the permanent magnets adjacent to each other are perpendicular to each other. According to this, in the embodiment, it is possible to secure the arrangement freedom of the second driving part and the third driving part for adjusting the electromagnetic force in response to the permanent magnet, it is possible to move in the X-axis and Y-axis, and stable tilt control is also possible.

Features, structures, effects, and the like described in the embodiments above are included in at least one embodiment, and are not necessarily limited to only one embodiment. Furthermore, the features, structures, effects, and the like illustrated in each embodiment may be combined or modified for other embodiments by a person having ordinary knowledge in the field to which the embodiments belong. Therefore, the contents related to these combinations and modifications should be construed as being included in the scope of the embodiment.

Although the embodiments have been described above, these are only examples and are not intended to limit the embodiments, and those of ordinary skill in the field to which the embodiments belong to various types not exemplified above without departing from the essential characteristics of the present embodiment. It will be seen that branch transformation and application are possible. For example, each component specifically shown in the embodiment can be modified and implemented. And differences related to these modifications and applications should be construed as being included in the scope of the embodiments set in the appended claims.

What is claimed is:

1. A substrate for an image sensor comprising:
a substrate portion;
a conductive pattern portion disposed on the substrate portion; and
a first driving part disposed at the substrate portion to move the image sensor in a first axis direction and a second axis direction intersecting the first axis direction,
wherein the substrate portion comprises:
a spring plate having an elastic member disposed in a first open region, and
an insulating layer disposed on the spring plate and having a second open region overlapping the first open region in a third axis direction perpendicular to the first axis direction and the second axis direction,
wherein the spring plate comprises:
a first plate part, and
a second plate part disposed around the first plate part with the first open region interposed therebetween, and connected to the first plate part by the elastic member, and
wherein the first driving part comprises:
a first driving part of a first group configured to move the image sensor in the first axis direction, and
a first driving part of a second group configured to move the image sensor in the second axis direction.

2. The substrate of claim 1, wherein the insulating layer comprises:
a first insulating part disposed on the first plate part, and
a second insulating part disposed on the second plate part.

3. The substrate of claim 2, wherein the conductive pattern portion comprises:
a first lead pattern part disposed on the first insulating part, and
a second lead pattern part disposed on the second insulating part.

4. The substrate of claim 3, wherein the insulating layer further comprises an extension insulating part disposed in the second open region to connect between the first and second insulating parts.

5. The substrate of claim 4, wherein the conductive pattern portion further comprises an extension pattern part disposed on the extension insulating part to connect between the first and second lead pattern parts.

6. The substrate of claim 1, wherein the first driving part is disposed on the first plate part.

7. The substrate of claim 6, wherein the first driving part comprises a coil.

8. The substrate of claim 7, further comprising a second driving part corresponding to the first driving part and including a magnet, wherein the second driving part comprises:
a second driving part of a first group corresponding to the first driving part of the first group, and
a second driving part of a second group corresponding to the first driving part of the second group.

9. The substrate of claim 8, wherein the first driving part of the first group comprises a first-first driving part and a first-third driving part,
wherein the first driving part of the second group comprises a first-second driving part and a first-fourth driving part,
wherein the second driving part of the first group comprises a second-first driving part and a second-third driving part corresponding to the first-first driving part and the first-third driving part, and
wherein the second driving part of the second group comprises a second-second driving part and a second-fourth driving part corresponding to the first-second driving part and the first-fourth driving part.

10. The substrate of claim 1, wherein the first axis direction is a X axis direction, and
wherein the second axis direction is a Y axis direction.

11. The substrate of claim 10, wherein the third axis direction is an optical axis direction, and
wherein the X axis direction and the Y axis direction are perpendicular to the optical axis direction.

12. A camera module comprising:
a housing;
a lens barrel disposed in the housing;
a lens assembly disposed in the lens barrel;
an image sensor substrate disposed in the housing;
first and second driving parts configured to move the image sensor substrate in a first axis direction and a second axis direction intersecting the first axis direction,
wherein the first driving part comprises:
a first driving part of a first group configured to move the image sensor substrate in the first axis direction with respect to the lens barrel, and
a first driving part of a second group configured to move the image sensor substrate in the second axis direction with respect to the lens barrel;
wherein the second driving part comprises:
a second driving part of a first group overlapping the first driving part of the first group in a third axis direction, and
a second driving part of a second group overlapping the first driving part of the second group in the third axis direction.

13. The camera module of claim 12, wherein the third axis direction is an optical axis direction, and
wherein the second driving part overlaps with the first-first driving part in the optical axis direction.

14. The camera module of claim 12, wherein the first driving part is disposed at the image sensor substrate, and
wherein the second driving part is disposed in a region of the housing facing the first driving part in the third axis direction.

15. The camera module of claim 12, wherein the image sensor substrate includes:
a substrate portion on which an image sensor is placed, and
a conductive pattern portion disposed on the substrate portion,
wherein the substrate portion includes a spring plate having an elastic member disposed in a first open region, and an insulating layer disposed on the spring plate and having a second open region overlapping the first open area in a third axis direction, and
wherein the spring plate includes:
a first plate part, and
a second plate part disposed around the first plate part with the first open region interposed therebetween and connected to the first plate part through the elastic member.

16. The camera module of claim 15, wherein the insulating layer includes a first insulating part disposed on the first plate part and a second insulating part disposed on the second plate part, and
wherein the conductive pattern portion includes a first lead pattern part disposed on the first insulating part and a second lead pattern part disposed on the second insulating part.

17. The camera module of claim 16, wherein the insulating layer further includes an extension insulating part disposed in the second open region and connecting the first insulating part and the second insulating part, and
wherein the conductive pattern portion further includes an extension pattern part disposed on the extension insulating part and connecting the first lead pattern part and the second lead pattern part.

18. The camera module of claim 12, wherein the first driving part includes a coil, and
wherein the second driving part includes a magnet corresponding to the coil.

19. The camera module of claim 12, wherein the first driving part of the first group comprises a first-first driving part and a first-third driving part,
wherein the first driving part of the second group comprises a first-second driving part and a first-fourth driving part,
wherein the second driving part of the first group comprises a second-first driving part and a second-third driving part corresponding to the first-first driving part and the first-third driving part, and
wherein the second driving part of the second group comprises a second-second driving part and a second-fourth driving part corresponding to the first-second driving part and the first-fourth driving part.

* * * * *